US006784457B2

(12) United States Patent
Yamazaki et al.

(10) Patent No.: US 6,784,457 B2
(45) Date of Patent: Aug. 31, 2004

(54) SEMICONDUCTOR DEVICE AND MANUFACTURING METHOD THEREOF

(75) Inventors: Shunpei Yamazaki, Tokyo (JP); Hideaki Kuwabara, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/735,204

(22) Filed: Dec. 12, 2000

(65) Prior Publication Data

US 2001/0025958 A1 Oct. 4, 2001

(30) Foreign Application Priority Data

Dec. 14, 1999 (JP) .......................................... 11-355205

(51) Int. Cl.[7] .............................................. H01L 29/04
(52) U.S. Cl. .............................. 257/72; 257/57; 257/59; 257/66; 349/106; 349/149
(58) Field of Search ............................. 257/57, 59, 66, 257/72; 438/149, 151; 349/106, 139, 149

(56) References Cited

U.S. PATENT DOCUMENTS

| 5,055,899 A | * 10/1991 | Wakai et al. ................ 257/61 |
| 5,247,190 A | 9/1993 | Friend et al. ................ 257/40 |
| 5,323,042 A | 6/1994 | Matsumoto ................ 257/350 |

(List continued on next page.)

FOREIGN PATENT DOCUMENTS

| JP | 7-130652 | 5/1995 |
| JP | 8-146402 | 6/1996 |
| JP | 08-160464 | 6/1996 |
| JP | 08-328000 | 12/1996 |
| JP | 10-092576 | 4/1998 |
| JP | 10-154814 | 6/1998 |
| JP | 10-247735 | 9/1998 |
| JP | 2000-315798 | 11/2000 |
| WO | WO 90/13148 | 11/1990 |

OTHER PUBLICATIONS

Schenk, H. et al, "Polymers for Light Emitting Diodes," *Eurodisplay '99, Proceedings of the 19th International Display Research Conference*, Sep. 6–9, 1999, Berlin, Germany, pp.33–37.
English abstract re Japanese Patent Application No. 7–130652, published May 19, 1995.
English abstract re Japanese Patent Application No. 8–146402, published Jun. 7, 1996.
English abstract re Japanese Patent Application No. 10–092576, published Apr. 10, 1998.
Yoshida et al. A Full Color Thresholdless Antiferroelectric LCD Exhibiting Wide Viewing Angle with Fast Response Time, SID 97 Digest pp. 841–844, 1997.
Furue et al. SID 98 Digest pp. 782–785, 1998.
Shimokawa et al. Characterization of High–Efficiency Cast–Si Solar Cell Wafers by MBIC Measurement Japanese Journal of Applied Physics vol. 27, No. 5, pp. 751–758, 1998.
U.S. patent application Ser. No. 09/516,082 filed Mar. 1, 2000 with specifications, drawings, filing receipt and claims as Amended (Amendment C).

*Primary Examiner*—George Eckert
(74) *Attorney, Agent, or Firm*—Cook Alex, McFarron, Manzo, Cummings & Mehler, Ltd.

(57) ABSTRACT

There is a problem in that, in a liquid crystal display panel in which a color filter is formed on an opposing substrate, it is necessary to assemble an element substrate and the opposing substrate by extremely high precision position alignment, and when this precision is low, the aperture ratio decreases and the display becomes darker. With the present invention, red color filters (R) are formed on driving circuits (402, 403), peripheral circuits, and a color filter (405*d*) for protecting a pixel TFT portion (407) is formed for each pixel.

46 Claims, 21 Drawing Sheets

U.S. PATENT DOCUMENTS

| | | | |
|---|---|---|---|
| 5,399,502 A | 3/1995 | Friend et al. ................ 438/22 |
| 5,412,493 A | 5/1995 | Kunii et al. |
| 5,414,547 A | 5/1995 | Matsuo et al. |
| 5,441,618 A | 8/1995 | Matsuda et al. |
| 5,499,123 A | 3/1996 | Mikoshiba |
| 5,594,569 A | 1/1997 | Konuma et al. |
| 5,643,826 A | 7/1997 | Ohtani et al. ............... 438/162 |
| 5,659,375 A | 8/1997 | Yamashita et al. |
| 5,677,207 A | 10/1997 | Ha ............................ 437/21 |
| 5,708,485 A | 1/1998 | Sato et al. |
| 5,708,486 A | 1/1998 | Miyawaki et al. |
| 5,726,720 A | 3/1998 | Watanabe et al. |
| 5,733,420 A | 3/1998 | Matsuda et al. |
| 5,815,226 A | 9/1998 | Yamazaki et al. |
| 5,818,550 A | 10/1998 | Kadota et al. ............... 349/43 |
| 5,821,622 A * | 10/1998 | Tsuji et al. ................ 257/763 |
| 5,923,962 A | 7/1999 | Ohtani et al. ............... 438/150 |
| 5,990,542 A * | 11/1999 | Yamazaki .................. 257/642 |
| 5,994,721 A * | 11/1999 | Zhong et al. ................ 257/89 |
| 6,002,462 A | 12/1999 | Sato et al. .................. 349/106 |
| 6,011,274 A * | 1/2000 | Gu et al. ..................... 257/59 |
| 6,031,290 A | 2/2000 | Miyazaki et al. |
| 6,031,512 A | 2/2000 | Kadota et al. ............... 345/88 |
| 6,078,060 A | 6/2000 | Shibuya et al. |
| 6,087,679 A | 7/2000 | Yamazaki et al. |
| 6,104,461 A | 8/2000 | Zhang et al. |
| 6,115,094 A * | 9/2000 | Fukunaga .................. 349/138 |
| 6,153,445 A | 11/2000 | Yamazaki et al. |
| 6,153,893 A * | 11/2000 | Inoue et al. ................. 257/72 |
| 6,201,585 B1 | 3/2001 | Takano et al. |
| 6,222,595 B1 | 4/2001 | Zhang et al. |
| 6,262,438 B1 | 7/2001 | Yamazaki et al. |
| 6,323,521 B1 | 11/2001 | Seo ........................... 257/347 |
| 6,341,003 B1 | 1/2002 | Ashizawa et al. |
| 6,346,718 B1 * | 2/2002 | Yamanaka et al. ........... 257/79 |
| 2003/0057419 A1 | 3/2003 | Murakami et al. ........... 257/72 |

\* cited by examiner

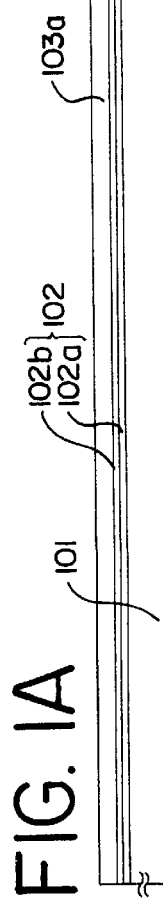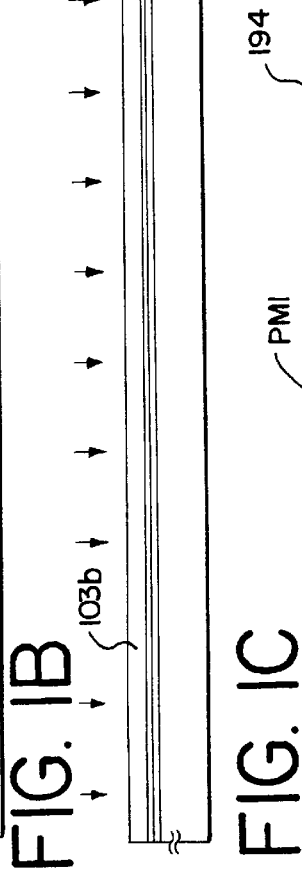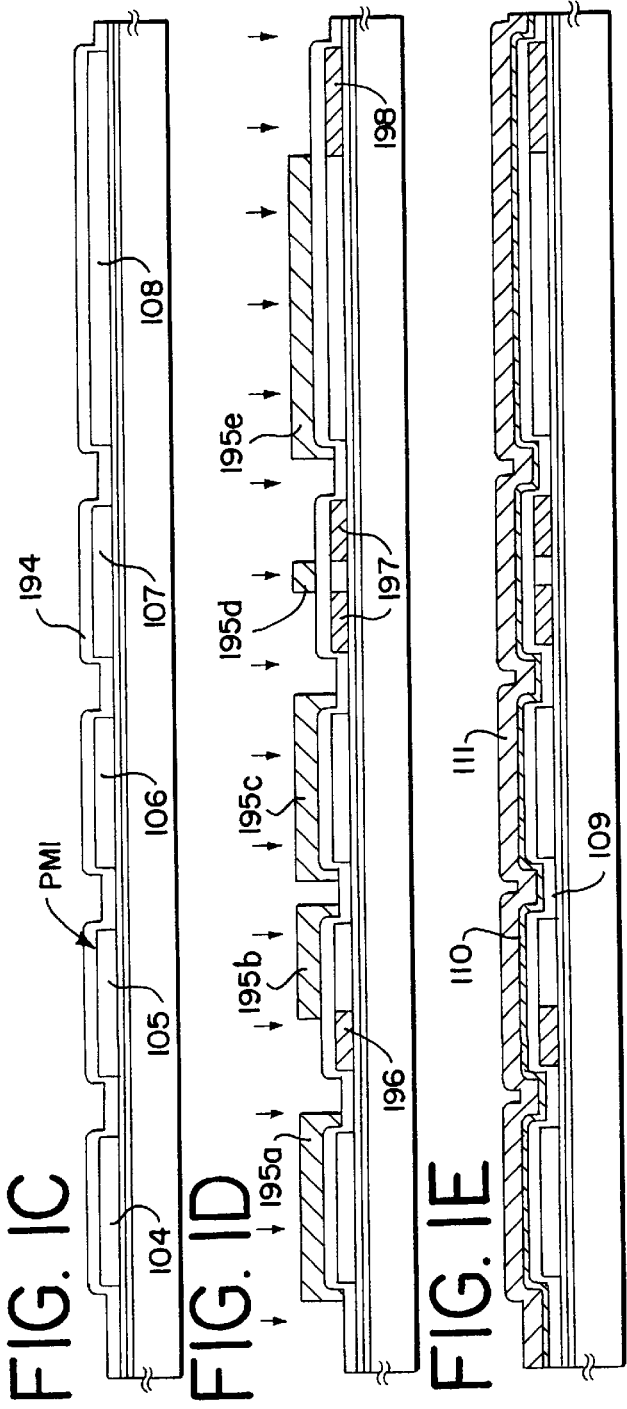

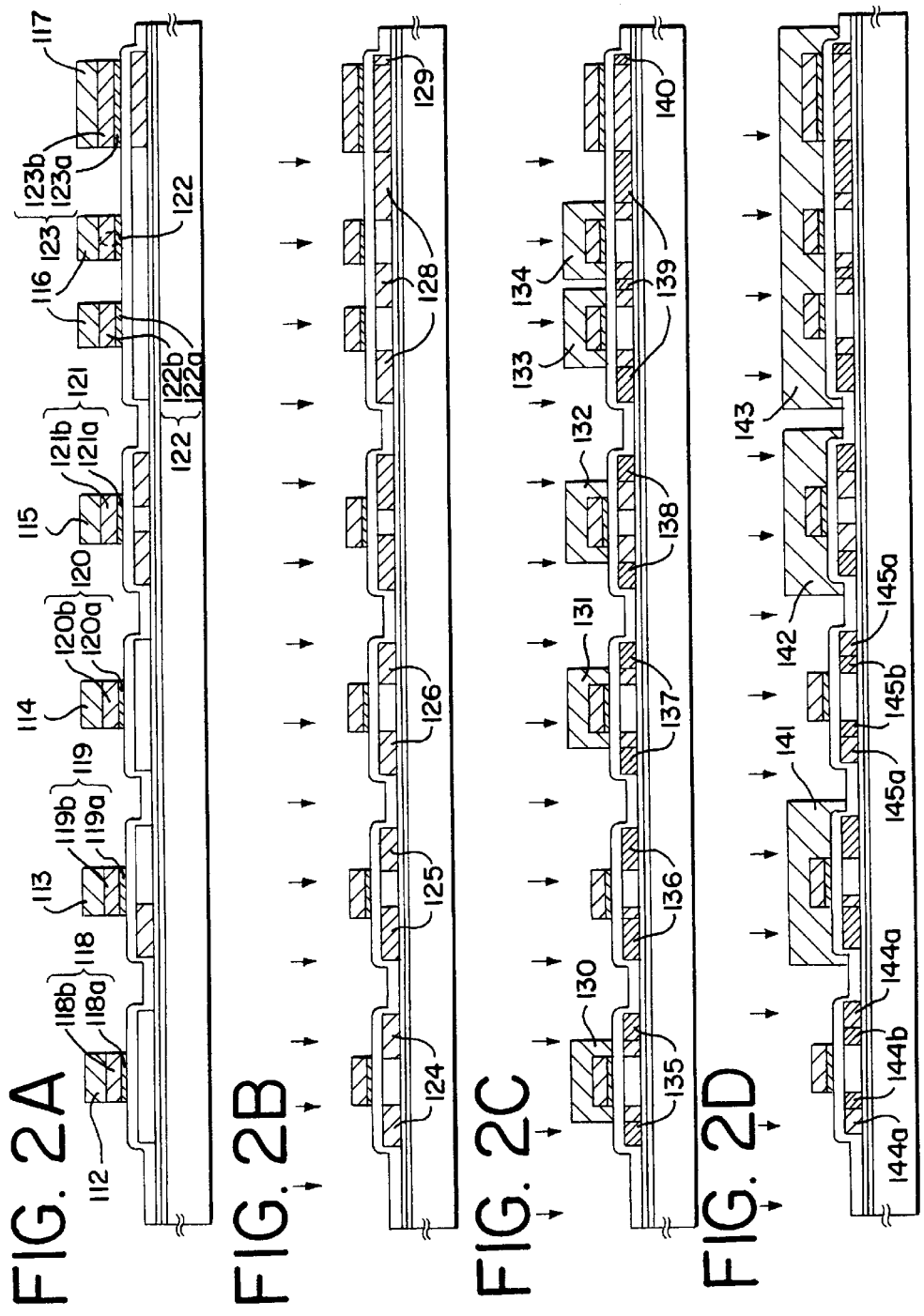

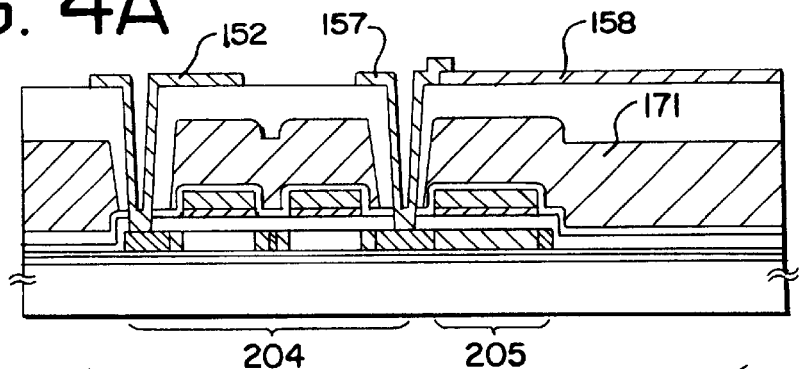
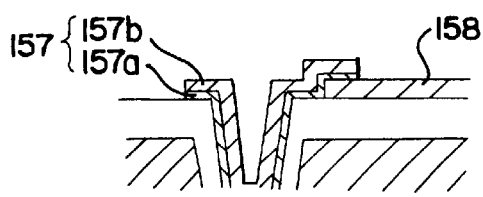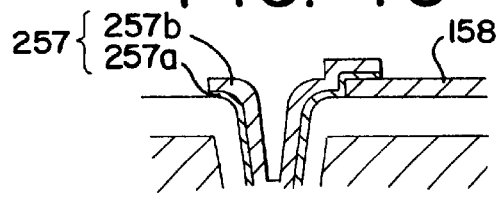
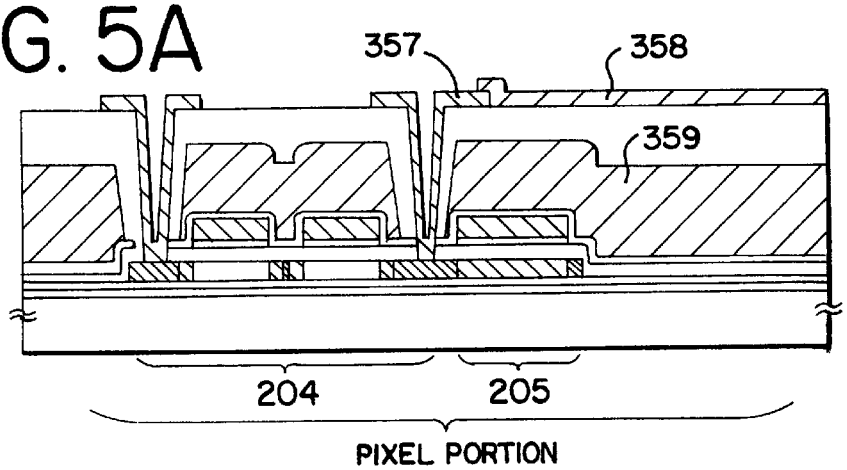
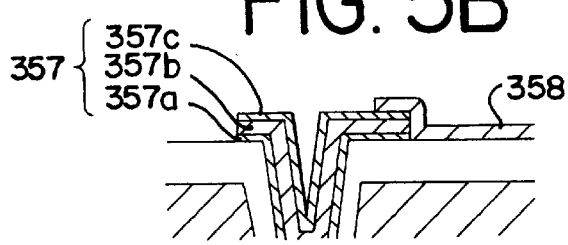

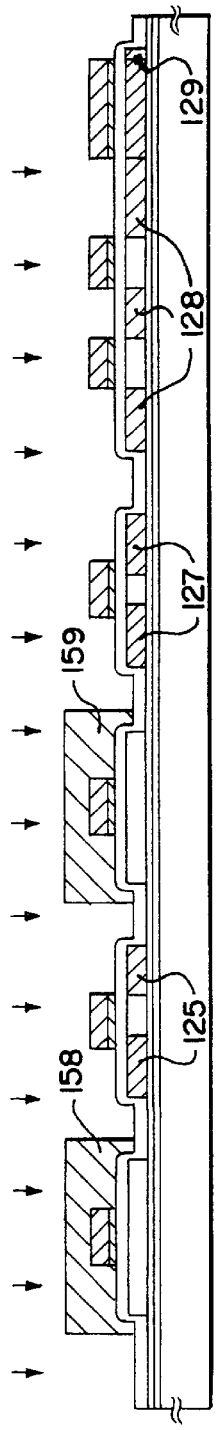
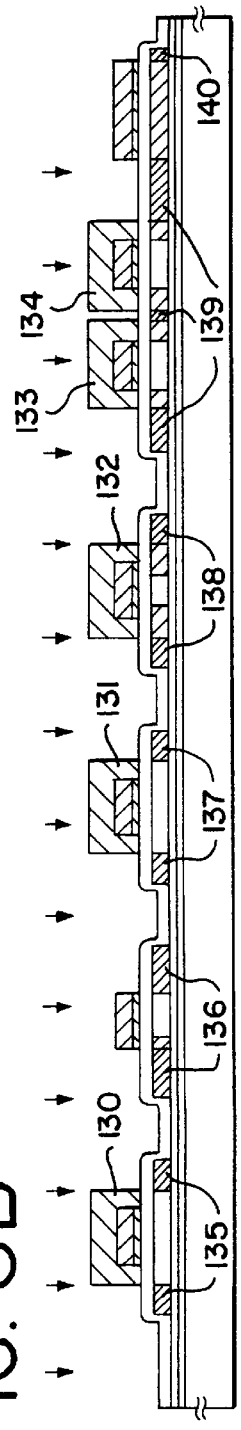
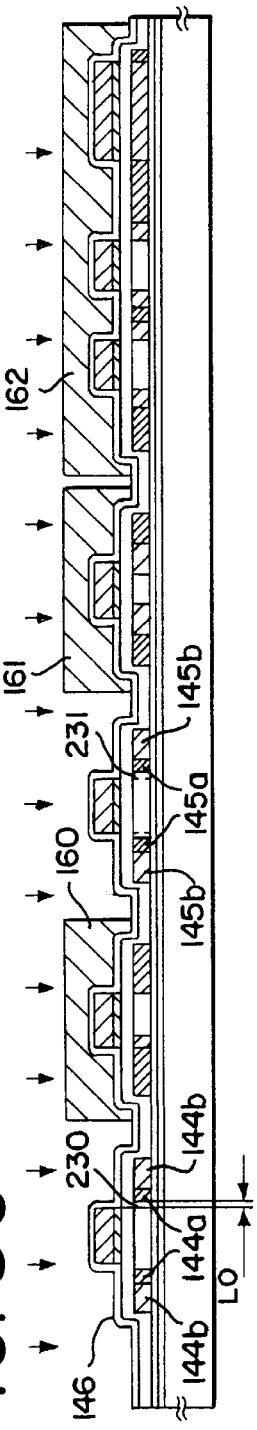

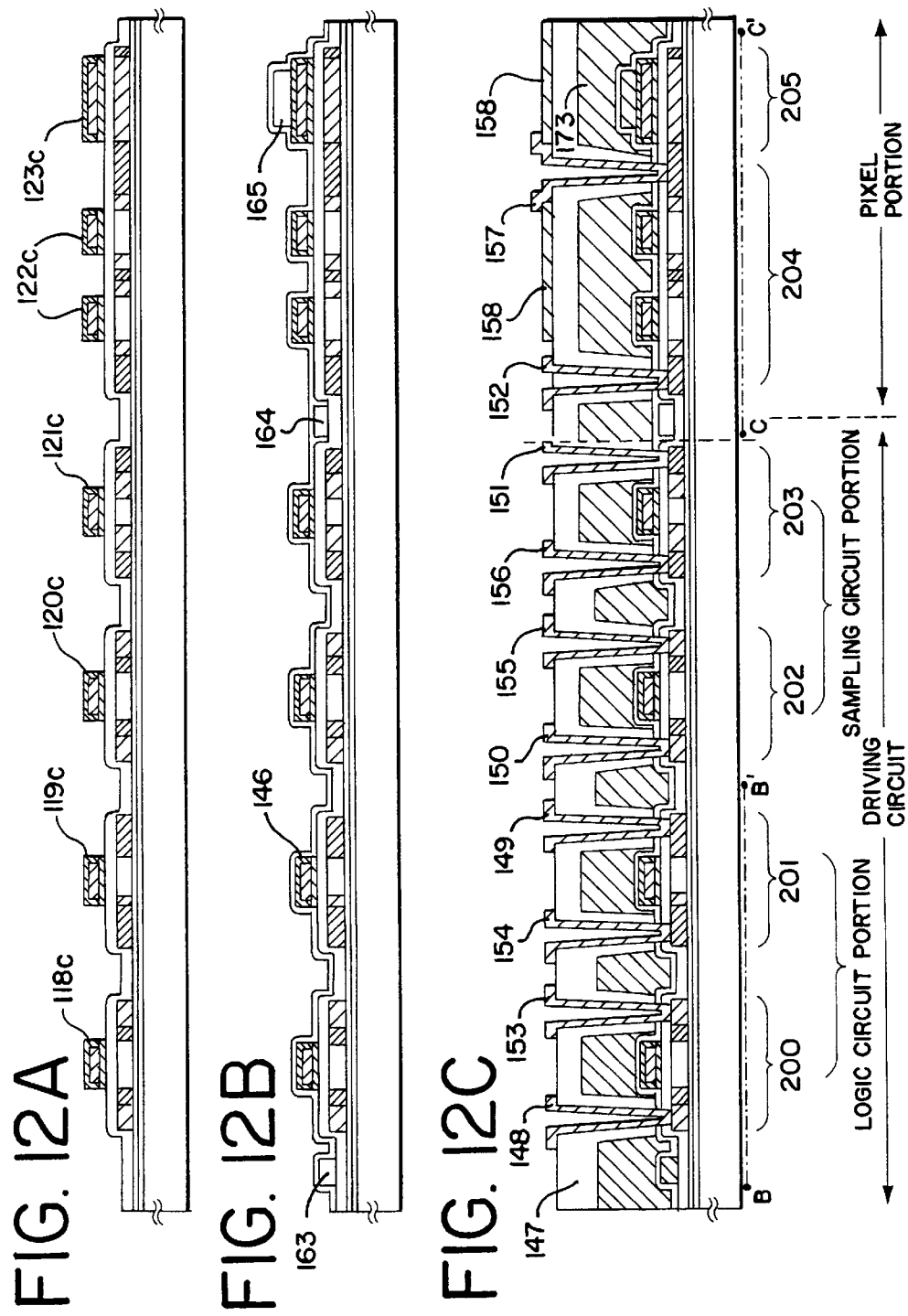

SEMICONDUCTOR DEVICE AND MANUFACTURING METHOD THEREOF

BACKGROUND OF THE INVENTION

1. Field of the Invention

The present invention relates to a semiconductor device containing a circuit structured by a thin film transistor (hereafter referred to as a TFT), and to a method of manufacturing thereof. For example, the present invention relates to an electro-optical device, typically a liquid crystal display panel or an EL display panel, and to electronic equipment (electronic instruments) loaded with this type of electro-optical device (electronic device) as a part.

Note that, throughout this specification, the term semiconductor device indicates general devices which function by utilizing semiconductor characteristics, and that electro-optical devices, semiconductor circuits, and electronic equipment are all semiconductor devices.

2. Description of the Related Art

Techniques of structuring a thin film transistor (TFT) using a semiconductor thin film (having a thickness on the order of several nm to several hundreds of nm) formed on a substrate having an insulating surface have been in the spotlight in recent years. The thin film transistor is widely applied in electronic devices such as ICs and electro-optical devices, and in particular, its development is accelerating as a switching device of a liquid crystal display panel or an EL display panel.

Amorphous silicon or polysilicon semiconductor TFTs are arranged in a matrix shape in a liquid crystal display panel, and a liquid crystal is maintained between an element substrate, on which pixel electrodes, source lines, and gate lines connected to each TFT are formed, and an opposing substrate having an opposing electrode. Further, a color filter for color display is formed on the opposing substrate. A polarizing plate is arranged as a light shutter in the element substrate and in the opposing substrate, and a color image is displayed.

The color filter of the liquid crystal display panel has R (red), G (green), and B (blue) colored films, and a shading mask left only between pixels, and red color, green color, and blue color light is extracted in accordance with light passing through. Furthermore, the shading mask of the color filter is generally structured by a metallic film or an organic film containing a black pigment. The color filter is formed in a position corresponding to the pixels, and the color of light output can thus be changed for every pixel. Note that the term position corresponding to the pixels indicates a position coinciding with the pixel electrodes.

Note also that, throughout this specification, the term color filter indicates one patterned colored film given a red, green, or blue color.

Further, among EL display devices, there is a colorizing method in which EL elements for emitting light showing a red color, a green color, or a blue color are arranged in a matrix state, and there is a colorizing method in accordance with a color filter used by EL elements which emit white color light. The colorizing method in accordance with a color filter used by EL elements which emit white color light is similar in principal to a colorizing method for a liquid crystal display device which uses a color filter.

With a liquid crystal display panel in which a color filter is formed in the opposing substrate, it is necessary to perform assembly of the element substrate and the opposing substrate with extremely high precision, and when this precision is low, the aperture ratio is reduced and there is a problem in which the display becomes darker.

Further, with a liquid crystal display panel in which a metallic film is used as a shading mask, a problem develops in which a signal delay easily generates due to a parasitic capacitance with other wirings. Furthermore, when an organic film is used, a problem that the number of process steps increases is caused.

In addition, with an EL display device using an EL element for emitting light showing a red color, a green color, or a blue color, the EL material differs for each color, and therefore the element characteristics also differ, and it becomes difficult to obtain a uniform display. For example, characteristics such as the deterioration speed of the EL material differ for each material, and therefore a problem in which the displays become dispersed due to elapsed time develops.

Furthermore, an EL display device using an EL element which emits white color light is, in principle, similar to a liquid crystal display device using a color filter, and therefore problems similar to those above develop.

SUMMARY OF THE INVENTION

An object of the present invention is to provide a semiconductor device, and a method of manufacturing the semiconductor device, in order to overcome the above problems.

A structure of the present invention disclosed in this specification is a semiconductor device having, on the same substrate:

a pixel TFT formed in a pixel portion; and a p-channel TFT and an n-channel TFT formed in a driving circuit in the periphery of the pixel portion;

characterized in that the p-channel TFT of the driving circuit, the n-channel TFT of the driving circuit, and the pixel TFT of the pixel portion have a color filter adjacent to a gate insulting film, and an interlayer insulating film comprising an organic insulating material in contact with the color filter.

Further, another structure of the present invention is a semiconductor device having, on the same substrate:

a pixel TFT formed in a pixel portion; and a p-channel TFT and an n-channel TFT formed in a driving circuit in the periphery of the pixel portion;

characterized in that the p-channel TFT of the driving circuit, the n-channel TFT of the driving circuit, and the pixel TFT of the pixel portion have: a protecting insulating film comprising an inorganic insulating material formed on a gate electrode; a color filter formed in contact with the protecting insulting film; and an interlayer insulating film comprising an organic insulating material in contact with the color filter.

Further, another structure of the present invention is a semiconductor device having, on the same substrate:

a pixel TFT formed in a pixel portion; and a p-channel TFT and an n-channel TFT formed in a driving circuit in the periphery of the pixel portion;

characterized in that:

the p-channel TFT of the driving circuit, the n-channel TFT of the driving circuit, and the pixel TFT of the pixel portion have: a protecting insulating film comprising an inorganic insulating material formed on a gate electrode; and a color filter formed in contact with the protecting insulting film; and a pixel electrode formed in the pixel portion is formed over the color filter, and is connected to a conducting metallic wiring which is connected to the pixel TFT and formed through an opening formed in at least the protecting insulating film and the color filter.

Furthermore, in the above structures the color filter formed over the gate electrode of the p-channel TFT and the n-channel TFT of the driving circuit is a colored film which is colored red.

In addition, in each of the above structures the color filter formed over the gate electrode of the pixel TFT is a colored film which is colored red.

Still further, in each of the above structures a pixel electrode formed in the pixel portion is formed on the interlayer insulating film, and is connected to a conducting metallic wiring which is connected to the pixel TFT and formed through an opening formed in at least the protecting insulating film and the interlayer insulating film.

Additionally, the pixel electrode formed in the pixel portion has light transmitting properties in each of the above structures.

Further, the p-channel TFT of the driving circuit is used at least as a transfer gate circuit, for example an analog switch, in each of the above structures.

Moreover, another structure of the present invention is a semiconductor device having, on the same substrate:
a pixel TFT formed in a pixel portion; and
a p-channel TFT and an n-channel TFT formed in a driving circuit in the periphery of the pixel portion;
characterized in that:
the p-channel TFT of the driving circuit, the n-channel TFT of the driving circuit, and the pixel TFT of the pixel portion have: a protecting insulating film comprising an inorganic insulating material formed on a gate electrode; a color filter formed in contact with the protecting insulting film; and an interlayer insulating film comprising an organic insulating material in contact with the color filter;
the pixel TFT of the pixel portion has a pixel electrode on the interlayer insulating film; and
the pixel TFT of the pixel portion is connected to an EL element having the pixel electrode as an anode.

In the above structure, the pixel electrode formed in the pixel portion is formed on the interlayer insulating film, and is connected to a conducting metallic wiring which is connected to the pixel TFT and formed through an opening formed in at least the protecting insulating film and the interlayer insulating film.

Further, another structure of the present invention is a semiconductor device having, on the same substrate:
a pixel TFT formed in a pixel portion; and
a p-channel TFT and an n-channel TFT formed in a driving circuit in the periphery of the pixel portion;
characterized in that:
the p-channel TFT of the driving circuit, the n-channel TFT of the driving circuit, and the pixel TFT of the pixel portion have: a protecting insulating film comprising an inorganic insulating material formed on a gate electrode; and a color filter formed on the protecting insulting film; and
a pixel electrode formed in the pixel portion is formed over the color filter; is connected to a conducting metallic wiring which is connected to the pixel TFT and formed through an opening formed in at least the protecting insulating film and the color filter; and is connected to an EL element having the pixel electrode as an anode.

The color filter formed over the gate electrode of the p-channel TFT and the n-channel TFT of the driving circuit is a colored film which is colored red in the above structure.

In each of the above structures, the color filter formed over the gate electrode of the pixel TFT is a colored film which is colored red.

In any one of the above respective structures, light emitted from the EL element is irradiated passing through the substrate.

BRIEF DESCRIPTION OF THE DRAWINGS

In the accompanying drawings:

FIGS. 1A to 1E are diagrams showing a process of manufacturing an active matrix substrate (Embodiment 1);

FIGS. 2A to 2D are diagrams showing the active matrix substrate (Embodiment 1);

FIGS. 4A to 4C are diagrams showing examples of pixel portion structures (Embodiment 1);

FIGS. 5A and 5B are diagrams showing an example of a pixel portion structure (Embodiment 2);

FIGS. 8A to 8C are diagrams showing a process of manufacturing an active matrix substrate (Embodiment 3);

FIGS. 12A to 12C are diagrams showing a process of manufacturing an active matrix substrate (Embodiment 6);

DETAILED DESCRIPTION OF THE PREFERRED EMBODIMENTS

Embodiment Mode

An embodiment mode of the present invention is explained below.

Figure 23:
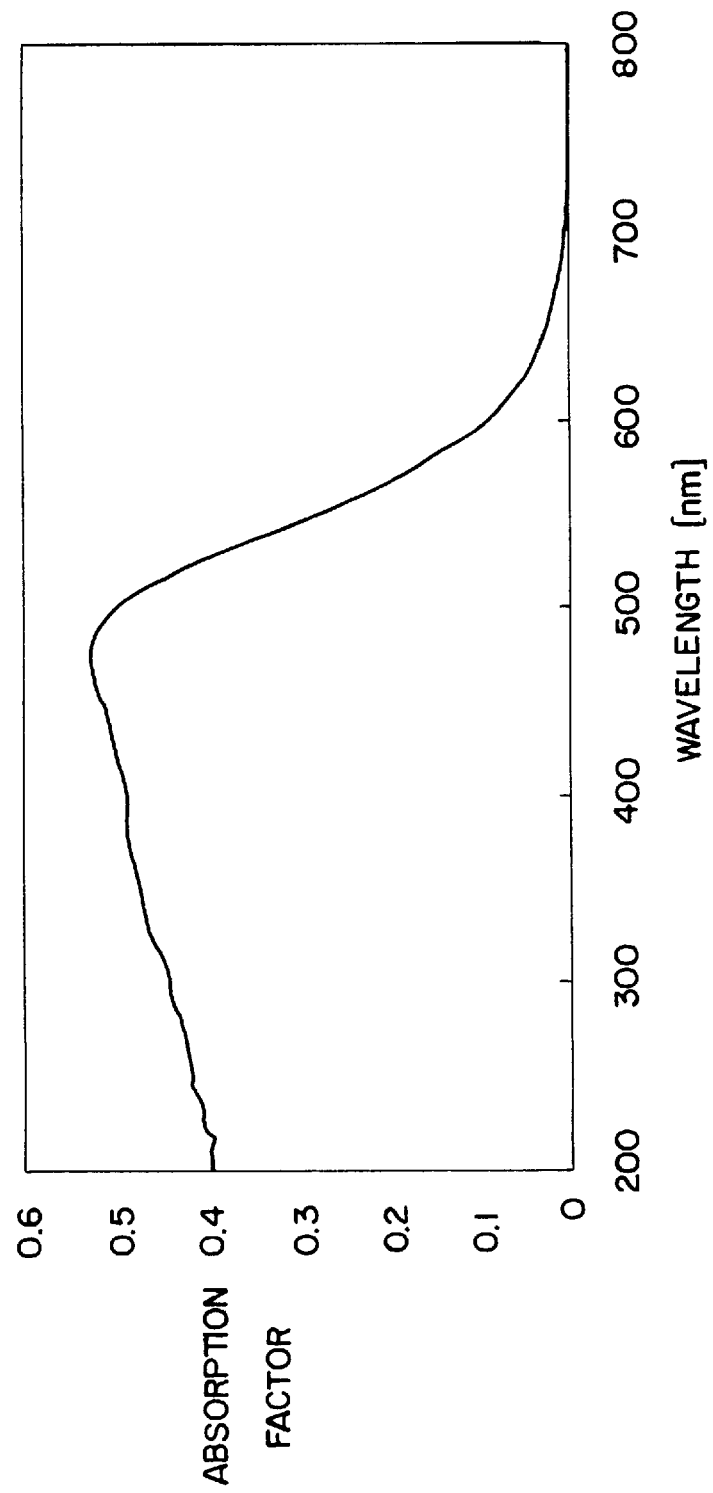
FIG. 23 is a graph showing absorptivity of light with respect to a non-single crystal silicon film.

In the present invention, a color filter is formed on an element substrate as a light shielding film of a TFT, and not on an opposing substrate. In particular, the wavelength of light passing through a red color filter is long, and imparts almost no influence to a non-single crystal silicon film, and is therefore effective. For reference, the relationship between absorptivity for a 55 nm thick non-single crystal silicon film and wavelength irradiated is shown in FIG. 23.

In order to protect from degradation due to light, a color filter (R) is formed on a gate electrode of a TFT, namely so as to cover a channel forming region. Specifically, a color filter is formed in contact with a protecting insulating film (such as a silicon nitride film) which covers a gate electrode, an interlayer insulating film is formed in contact with the color filter, and a pixel electrode is formed on the interlayer insulating film. The interlayer insulating film is formed for leveling, and the interlayer insulating film need not be formed provided that the color filter possesses sufficient insulating and leveling characteristics. Further, the protecting insulating film plays a vital role in preventing contamination by impurities contained in the color filter.

Beginning with most simple stripe pattern, there are color filters such as diagonal mosaic arrays, triangular mosaic arrays, RGBG four pixel arrays, and RGBW four pixel arrays.

Figure 6A:
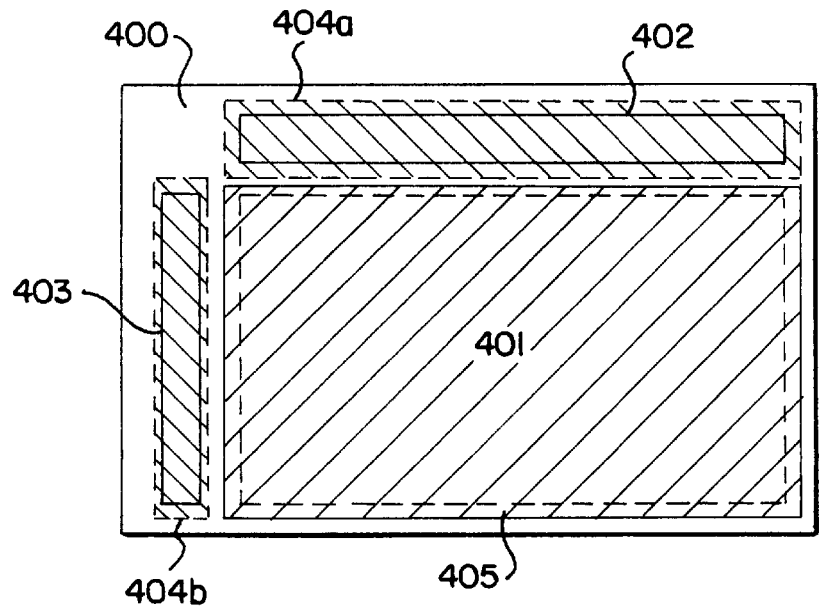
FIGS. 6A and 6B are diagrams showing a color filter arrangement example.
Figure 6B:
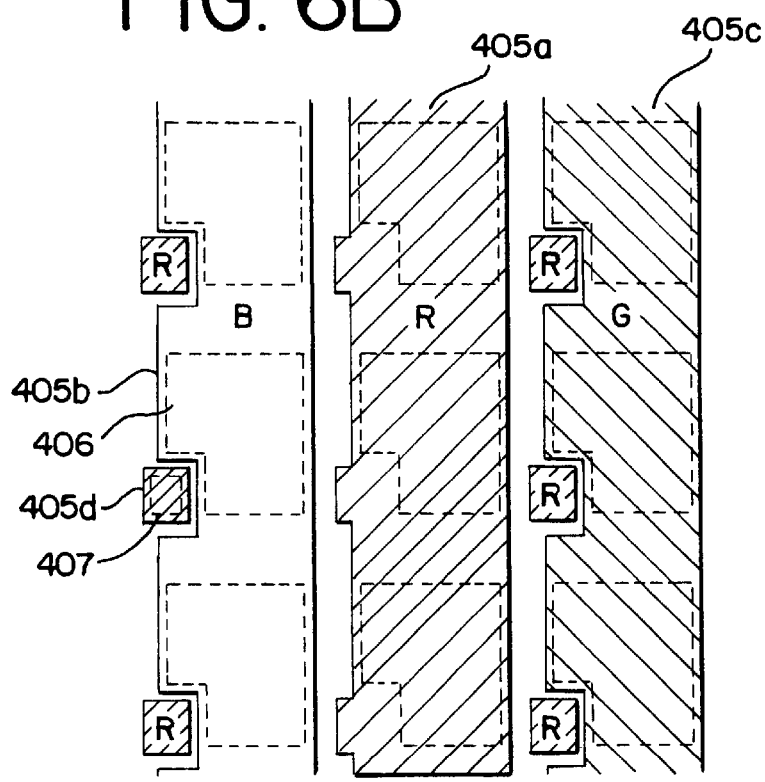

An example of applying the present invention in a case of using a stripe shape color filter is shown in FIGS. 6A and 6B. FIG. 6A is a top view showing, in brief, an arrangement relationship between a pixel portion 401, a source line side driving circuit 402, and a gate line side driving circuit 403, and color filters 404 and 405, formed on a substrate 400. With the present invention, red color filters (R) 404a and 404b are formed on the driving circuits 402 and 403 which are peripheral circuits, and prevent light degradation of an active layer of a TFT at the same time as fulfilling a leveling role. Further, a color filter (B) 405b, a color filter (R) 405a, and a color filter (G) 405c are repeatedly arranged in a stripe shape on the pixel portion 401. A schematic diagram of an enlargement of a portion of pixels (3×3 array) is shown in FIG. 6B. A color filter 405d for protecting a pixel TFT portion 407 is formed for each pixel, as shown in FIG. 6B. Note that source lines, gate lines, and electrodes are not shown in the figure here, but they are arranged so as to overlap with the gap between each of the color filters, and therefore light does not leak. The color filters 405d thus play a role as a black mask, and a heretofore required step of forming a black mask can therefore be omitted. Further, a contact hole for connecting the pixel electrode and the pixel TFT is not shown in the figure here, but in practice the color filter is formed in a layer between the pixel TFT and the pixel electrode, and therefore an opening exists in the contact hole location.

Figure 7A:
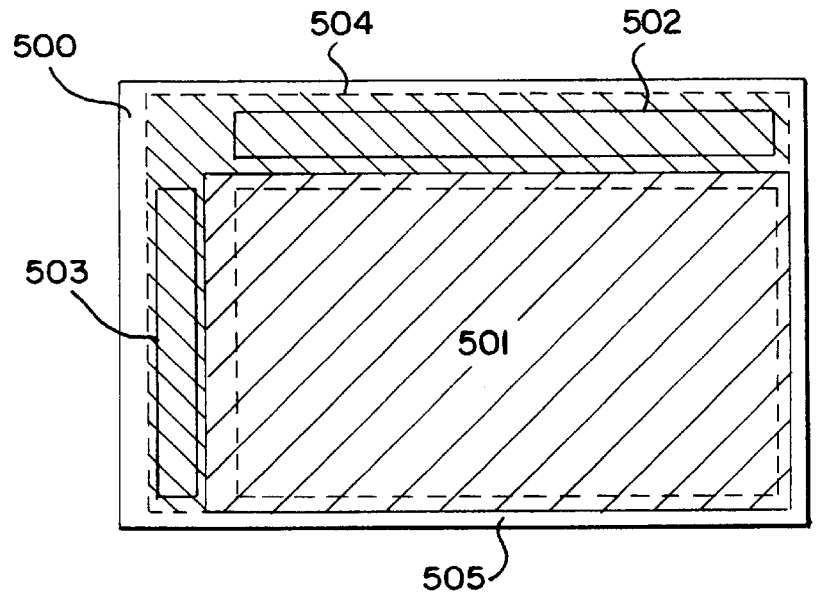
FIGS. 7A and 7B are diagrams showing a color filter arrangement example.
Figure 7B:
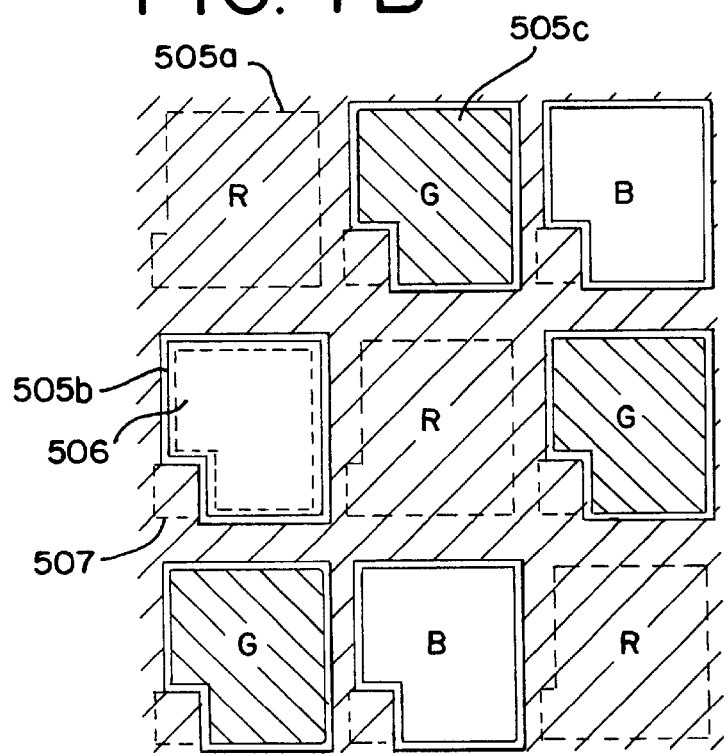

Further, an example of applying the present invention in a case of using a matrix shape color filter is shown in FIGS. 7A and 7B. FIG. 7A is a top view showing, in brief, an arrangement relationship between a pixel portion 501, a source line side driving circuit 502, and a gate line side driving circuit 503, and color filters 504 and 505, formed on a substrate 500. With the present invention, a red color filter (R) 504a is formed on the driving circuits 502 and 503 which are peripheral circuits, and this prevents light degradation of an active layer of a TFT at the same time as fulfilling a leveling role. Further, a color filter (B) 505b and a color filter (G) 505c are arranged in a matrix shape, and a color filter (R) 505a is formed so as to be imbedded in the gap between the color filters 505b and 505c. A schematic diagram of an enlargement of a portion of pixels (3×3 array) is shown in FIG. 7B. Color filters 505d for protecting a pixel TFT portion 507 are mutually connected, as shown in FIG. 7B. Note that source lines, gate lines, and electrodes are not shown in the figure here, but they are arranged so as to overlap with the gap between each of the color filters, and therefore light does not leak. The color filters 505a thus play a role as a black mask, and a heretofore required step of forming a black mask can therefore be omitted. Further, a contact hole for connecting the pixel electrode and the pixel TFT is not shown in the figure here, but in practice the color filter is formed in a layer between the pixel TFT and the pixel electrode, and therefore an opening exists in the contact hole location.

Further, the color filter arrangements shown by FIGS. 6A and 6B, and 7A and 7B are examples, and there are no particular limitations in placement or shape. The color filter (R) may be suitably formed at least on the gate electrode of the TFT, namely so as to cover the channel forming region.

Further, the present invention can be applied to any display device, provided that it uses an active matrix substrate, and for example the present invention can be applied to a liquid crystal display device and to an EL display device. In an EL display device using an EL element which emits white light, a pixel electrode is taken as an anode, and light emitted from the EL element is irradiated by passing through the active matrix substrate. Moreover, even in an EL display device using an EL element which emits colored light, the present invention can be applied in cases where a color filter is used in order to raise the color purity.

A more detailed explanation of the present invention, having the above structure, is given by the embodiments shown below.

[Embodiment 1]

An embodiment of the present invention will be explained with reference to FIGS. 1A to 3C. In this embodiment, a method of forming simultaneously pixel TFTs and storage capacitors of a pixel section and TFTs of a driving circuit disposed in the periphery of the display region will be explained step-wise in detail.

In FIG. 1A, as well as barium borosilicate glass or aluminoborosilicate glass as typified by Corning #7059 glass and #1737 glass, plastic substrates which do not have optical anisotropy such as polyethylene terephthalate (PET), polyethylene naphthalate (PEN), polyethersulfone (PES), etc., can be used as the substrate 101. When the glass substrate is used, the substrate may be heat-treated in advance at a temperature lower by about 10 to 20° C. than a glass strain point. A base film 102 of a silicon oxide film, a silicon nitride film or a silicon oxynitride film, etc. is formed on the surface of the substrate 101, on which TFT is to be formed, in order to prevent the diffusion of impurities from the substrate 101. For example, the silicon oxynitride film 102a is formed from $SiH_4$, $NH_3$ and $N_2O$ to a thickness of 10 to 200 nm (preferably, 50 to 100 nm) by plasma CVD, and a hydrogenated silicon oxynitride film 102b is similarly formed from $SiH_4$ and $N_2O$ to a thickness of 50 to 200 nm (preferably, 100 to 150 nm) in lamination.

The silicon oxynitride film is formed by using the conventional parallel plate type plasma-enhanced CVD. The silicon oxynitride film 102a is formed by introducing $SiH_4$ at 10 sccm, $NH_3$ at 100 sccm and $N_2O$ at 20 sccm into a reaction chamber under the condition of a substrate temperature of 325° C., a reaction pressure of 40 Pa, a discharge power density of 0.41 W/cm$^2$ and a discharge frequency of 60 MHZ. On the other hand, the silicon oxynitride film 102b is formed by introducing $SiH_4$ at 5 sccm, $N_2O$ at 120 sccm and $H_2$ at 125 sccm into a reaction chamber under the condition of a substrate temperature of 400° C., a reaction pressure of 20 Pa, a discharge power density of 0.41 W/cm$^2$ and a discharge frequency of 60 MHZ. These films can be formed by only changing the substrate temperature and by switching the reactive gases.

The silicon oxynitride film 102a thus formed has a density of $9.28 \times 10^{22}$/cm$^3$, has an etching rate of about 63 nm/min in a mixed solution ("LAL500," a product of Stella Chemifa Co.) containing 7.13% of ammonium hydrogenfluoride ($NH_4HF_2$) and 15.4% of ammonium fluoride at 20° C., and is a compact and hard film. When such a film is used for the base film, the diffusion of alkali metal elements from the glass substrate into the semiconductor layers formed thereon can be effectively prevented.

Next, a semiconductor layer 103a having an amorphous structure is formed to a thickness of 25 to 80 nm (preferably, 30 to 60 nm) by a known method such as plasma CVD or sputtering. For example, the amorphous silicon film is formed to a thickness of 55 nm by plasma CVD. Semiconductor films having such an amorphous structure include an amorphous semiconductor film and a micro crystalline semiconductor film, and a compound semiconductor film having an amorphous structure such as an amorphous silicongermanium film may also be used. It is possible to continuously form the base film 102 and amorphous semiconductor layer 103a. For example, after the silicon oxynitride film 102a and the hydrogenated silicon oxynitride film 102b are formed continuously by plasma CVD as described above, the film formation can be carried out continuously by switching the reactive gases from $SiH_4$, $N_2O$ and $H_2$ to $SiH_4$ and $H_2$, or $SiH_4$ alone, without exposing them once to the atmosphere of the open air. As a result, the contamination of the surface of the hydrogenated silicon oxynitride film 102b can be prevented, and the variance of the characteristics of the TFT to be fabricated and fluctuation of the threshold voltage can be reduced.

The crystallization step is then carried out to form a crystalline semiconductor layer 103b from the amorphous semiconductor layer 103a. A laser annealing method, a thermal annealing method (solid phase growth method) or a rapid thermal annealing (RTA) method can be used for this method. It is preferable to employ the laser annealing method when the glass substrate or the plastic substrate having a low heat resistance as described above is used. The RTA method uses an IR lamp, a halogen lamp, a metal halide lamp or a xenon lamp as the light source. Alternatively, the crystalline semiconductor layer 103b can be formed by the crystallization method using a catalytic element in accordance with the technology disclosed in Japanese Patent Application Laid-Open No. 7-130652. In the crystallization step, hydrogen contained in the amorphous semiconductor layer is first discharged preferably. It is good to perform the crystallization step after heat-treatment is conducted at 400 to 500° C. for about 1 hour to lower the hydrogen content to 5 atom % or below, because roughness of the film surface can be prevented advantageously.

When the crystallization step is conducted by the laser annealing method, a pulse oscillation type or continuous light emission type excimer laser, or an argon laser is used as the light source. When the pulse oscillation type excimer laser is used, the laser beam is processed to a linear shape and laser annealing is then conducted. The laser annealing condition can be selected appropriately by the operator. For example, the laser pulse oscillation is 30 Hz and the laser energy density is 100 to 500 mJ/cm$^2$ (typically, 300 to 400 mJ/cm$^2$). The linear beams are irradiated to the entire surface of the substrate, and the overlap ratio of the linear beams at this time is 80 to 98%. In this way, the crystalline semiconductor layer 103b can be obtained as shown in FIG. 1B.

A resist pattern is formed on the crystalline semiconductor layer 103b by photolithography that uses a photo-mask. The crystalline semiconductor layer is divided into an island shape by dry etching, forming thereby island semiconductor layers 104 to 108. A mixed gas of $CF_4$ and $O_2$ is used for dry etching. A mask layer 194 is then formed from a silicon oxide film having 50 to 100 nm thickness by plasma-enhanced CVD or sputtering (FIG. 1C).

An impurity for imparting the p-type may be applied at a concentration of about $1 \times 10^{16}$ to $5 \times 10^{17}$ atoms/cm$^3$ to the entire surface of the island semiconductor layers of this state to control the threshold voltage (Vth) of the TFTs. The elements of the Group XIII of the periodic table such as boron (B), aluminum (Al) or gallium (Ga) are known as the impurity elements for imparting p-type to the semiconductor. Ion implantation or ion doping is known as the method of introducing these elements, but ion doping is suitable for processing a substrate having a large area. This ion doping method uses diborane ($B_2H_6$) as a source gas and adds boron (B). Addition of such an impurity element is not always necessary and may be omitted, however, this is the method that can be used appropriately for keeping the threshold voltage of specifically the n-channel TFT, within a predetermined range.

In order to form an LDD region of the n-channel TFT of the driving circuit, an impurity element that imparts n-type is selectively doped into island semiconductor layers 105 and 107. For this purpose, resist masks 195a to 195e are formed. It is appropriate to use phosphorous (P) or arsenic (As) as the impurity element that imparts n-type. Ion doping using phosphine ($PH_3$) is applied here for doping phosphorous (P). The phosphorous (P) concentration in the formed low concentration n-type impurity regions 196 and 197 are in the range of $2 \times 10^{16}$ to $5 \times 10^{19}$ atoms/cm$^3$. Note that throughout the present specification, the concentration of the impurity element that imparts n-type contained in the impurity regions 196 and 197 formed here is indicated by (n$^-$). In addition, an impurity region 198, a semiconductor layer for forming a storage capacitor of the pixel portion, is also doped with phosphorous (P) at the same concentration. (See FIG. 1D) After removing the resist masks 195a to 195e, the step of activating the doped impurity element is performed next. The activation can be performed by methods such as laser activation or heat treatment performed in a nitrogen atmosphere at 500° C. to 600° C. for 1 to 4 hours, or both methods may be used together. For the case of employing the laser activation method, the KrF excimer laser light (wavelength of 248 nm) is used to form a linear shape beam with the oscillating frequency set between 5 and 50 Hz, the energy density set between 100 and 500 mJ/cm$^2$ to scan at an overlapping ratio of between 80% and 98% to thereby treat the entire surface of the substrate on which the island-like semiconductor layer is formed. Note that there are no limitations placed on the irradiation conditions of the laser light, appropriate irradiation conditions may be determined by an operator. The mask layer 194 is removed by etching with a solution such as fluorine.

A gate insulating film 109 is formed from an insulating film containing silicon at a film thickness of between 40 and 150 nm by plasma CVD or sputtering. For example, it is appropriate to form the gate insulating film at a thickness of 120 nm from a silicon oxide nitride film. In addition, a silicon oxide nitride film made from $SiH_4$ and $N_2O$, both doped with $O_2$, is a favorable material for the application here because the fixed electric charge density has been reduced. The gate insulating film, of course, is not limited to such silicon oxide nitride film. A single layer or a laminated layer of other insulating films containing silicon may be used. (See FIG. 1E) As shown in FIG. 1E, a heat-resistant conductive layer, for forming a gate electrode on the gate insulating film 109, is formed. The heat-resistant conductive layer may be formed as a single layer, or if necessary, it may have a laminated structure formed of a plurality of layers, such as two or three layers. Using such heat-resistant conductive materials, a lamination structure of, for example, a conductive layer (A) 110 formed from a conductive nitride metallic film and a conductive layer (B) 111 formed from a metallic film, is appropriate. The conductive layer (B) 111 may be formed from an element selected from the group consisting of tantalum (Ta), titanium (Ti), molybdenum (Mo), and tungsten (W); or an alloy having the above elements as its principal constituent; or an alloy film formed from a combination of the above elements (typically, an Mo—W alloy film and an Mo—Ta alloy film). The conductive layer (A) 110 is formed of elements such as a tantalum nitride (TaN), tungsten nitride (WN), titanium nitride (TiN) films, and a molybdenum nitride (MoN). Additionally, tungsten silicide, titanium silicide, and molybdenum silicide are also applicable for forming the conductive layer (A) 110. For the purpose of lowering the resistance of the conductive layer (B) 111, it is favorable to reduce the concentration of the impurity element contained therein, particularly, in regards to the oxygen concentration, better at 30 ppm or less. For example, a resistivity of 20 $\mu\Omega$cm or less can be realized provided that the oxygen concentration of tungsten (W) is 30 ppm or less.

It is appropriate to form the conductive layer (A) 110 at a thickness of between 10 and 50 nm (preferably between 20 and 30 nm), and the conductive layer (B) 111 at a thickness of between 200 and 400 nm (preferably between 250 and 350 nm). For the case of using W as the gate electrode, a 50 nm thick conductive layer (A) 111 formed of a tungsten nitride (WN) and a 250 nm thick conductive layer (B) 110 formed of W are formed by sputtering with W as the target and introducing argon (Ar) gas and nitrogen ($N_2$) gas. As another method, the W film may also be formed by thermal CVD using tungsten hexafluoride ($WF_6$). In any case, it is necessary to lower the resistance of the W film for use as the gate electrode, the desired resistivity of the W film is 20 $\mu\Omega$cm or less. Growing larger crystal grains in the W film can lower the resistivity. However, crystallization is impeded when many impurity elements exist in the W, such as oxygen, then the W film becomes high resistance. Because of this, a W target having 99.9999% degree of purity is utilized for the case of sputtering, and furthermore, sufficient consideration must be made to prevent an impurity from the vapor from mixing into the films during film deposition. Accordingly, a resistivity of between 9 and 20 $\mu\Omega$cm can be realized.

On the contrary, for the case of using a TaN film as the conductive layer (A) 110 and a Ta film as the conductive layer (B) 111, similarly, both can be formed by sputtering. The TaN film, with Ta as the target, is formed by utilizing a gaseous mixture of Ar and nitrogen as the sputtering gas while only Ar is utilized as the sputtering gas for the Ta film. Further, the internal stress of the films to be formed may be relaxed by adding a moderate amount of Xe or Kr into the sputtering gas of these films to prevent the films from peeling. The resistivity of an α phase Ta film is about 20 $\mu\Omega$cm, and therefore it can be used as the gate electrode. Contrary to this, the resistivity of a β phase Ta film is about 180 $\mu\Omega$cm, and therefore it is unsuitable to be used as the gate electrode. Since the TaN film has a crystal structure close to the α phase, the α phase Ta film can be readily obtained by forming the Ta film on the TaN film. Although not shown in the figure, note that it is effective to form a phosphorous (P) doped silicon film at a thickness of between 2 and 20 nm under the conductive layer (A) 110. Due to this, the adhesion of the conductive film formed on the silicon film can be improved and averted from being oxidized, as well as preventing the very small amount of alkali metallic elements contained in the conductive layer (A) 110 or the conductive layer (B) 111 from diffusing into the gate insulating film 109.

Nevertheless, it is preferred that the conductive layer (B) 111 be formed within the resistivity range of between 10 and 50 $\mu\Omega$cm.

With employment of the photomask, resist masks 112 through 117 are formed next by utilizing the photolithography technique. Then the conductive layer (A) 110 and the conductive layer (B) 111 are etched together to form gate electrodes 118 through 122 and a condenser wiring 123. The gate electrodes 118 through 122 and the condenser wiring 123 are integrally formed with layers 118a to 122a, formed of the conductive layer (A), and with layers 118b to 122b, formed of the conductive layer (B). (See FIG. 2A)

A method of etching the conductive layer (A) and the conductive layer (B) may be appropriately selected by the operator. As stated above, if the conductive layers are formed of a material having W as its principal constituent, it is desired that the dry etching method using high-density plasma be applied for implementing a speedy and precise etching. As one means of attaining high-density plasma, it is appropriate to employ the ICP (Inductively Coupled Plasma) etching devices. In the etching method of W employing the ICP etching device, two types of gas, $CF_4$ and $Cl_2$ are introduced into the reaction chamber as etching gas, pressure is set between 0.5 and 1.5 Pa (preferably 1 Pa), and a high frequency electric power (13.56 MHZ) of between 200 and 1000 W is applied to the inductively coupled portion. At this point, a 20 W high frequency electric power is applied to the stage with a substrate disposed therein. Due to charging a negative electric potential by self-bias, a positive ion is accelerated to thereby perform anisotropy etching. With employment of the ICP etching device, an etching speed of between 2 and 5 nm/sec can be achieved even in a hard metallic film such as W. In order to perform etching without leaving any residues, the etching time may be increased by about 10% to 20% to perform over-etching. However, attention must be paid to the selective ratio of etching with the base layer at this point. For example, the selective ratio of the oxidized silicon nitride film (the gate insulating film 109) to the W film is between 2.5 and 3. Due to such over-etching treatment, the exposed surface of the oxidized silicon nitride film is etched about 20 to 50 nm, substantially making the film becomes thinner.

The step of doping an impurity element that imparts n type (n⁻ doping step) is performed next to form an LDD region in the n-channel TFT of the pixel TFT. Using the gate electrodes 118 through 122 as a mask, the impurity element that imparts n-type is doped by ion doping in a self-aligning manner. The concentration of phosphorous (P), as the impurity element imparting n-type, is doped at a concentration range from $1\times10^{16}$ to $5\times10^{19}$ atoms/cm$^3$. Low concentration n-type impurity regions 124 to 129 are thus formed in the island-like semiconductor layer as shown in FIG. 2B.

The step of forming a high concentration n-type impurity region (n$^+$ doping step) to function as a source region or a drain region in the n-channel TFT is performed next. 20 First, resist masks 130 through 134 are formed by using the photomask, then an impurity element that imparts n-type is doped to thereby form the high concentration n-type impurity regions 135 through 140. Phosphorous (P) is used as the impurity element imparting n-type. Ion doping using phosphine (PH$_3$) is performed so that the concentration of phosphorous will be in the concentration range from $1\times10^{20}$ to $1\times10^{21}$ atoms/cm$^3$. (See FIG. 2C)

Next, high concentration p-type impurity regions 144 and 145 are formed as a source region or a drain region in the island-like semiconductor layers 104 and 106 that form the p-channel TFT. Using the gate electrodes 118 and 120 as masks, an impurity element that imparts p-type is doped to thereby form the high concentration p-type impurity region in a self-aligning manner. At this point, the island-like semiconductor films 105, 107, and 108, which form the n-channel TFT, covers the entire surface of resist masks 141 through 143 formed by using the photomask (PM4). High concentration p-type impurity regions 144 and 145 are formed by ion doping using diborane (B$_2$H$_6$). The boron (B) concentration in this region is set to be between $3\times10^{20}$ and $3\times10^{21}$ atoms/cm$^3$. (See FIG. 2D) In a previous step, phosphorous has been doped into the high concentration p-type impurity regions 144 and 145. Accordingly, the high concentration p-type impurity regions 144a and 145a have a concentration of between $1\times10^{20}$ and $1\times10_{21}$ atoms/cm$^3$ and the high concentration p-type impurity regions 144b and 145b have a concentration of between $1\times10^{16}$ and $5\times10^{19}$ atoms/cm$^3$. By doping boron (B) at a concentration of 1.5 to 3 times that of phosphorous in this step, there are no problems whatsoever as to the high concentration p-type impurity regions 144b and 145b functioning as a source region and a drain region of the p-channel TFT.

Figure 3A:
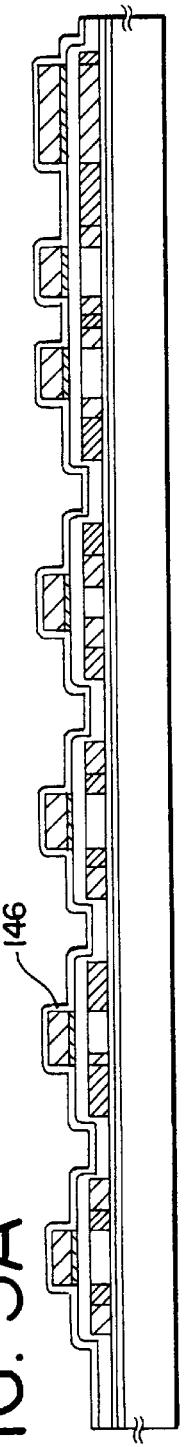
FIGS. 3A to 3C are diagrams showing the process of manufacturing the active matrix substrate (Embodiment 1)

Thereafter, as shown in FIG. 3A, a protective insulating film 146 is formed from above the gate electrode and the gate insulating film. The protective insulating film may comprise a silicon oxide film, a silicon oxynitride film, a silicon nitride film or a laminate film of the combination of these films. In any case, the protective insulating film 146 is formed of an inorganic insulating material. The protective insulating film 146 has a film thickness of 100 to 200 nm. When the silicon oxide film is used, the film may be formed by plasma CVD, mixing tetraethyl orthosilicate (TEOS) and O$_2$, and setting the reaction pressure at 40 Pa, the substrate temperature of 300 to 400° C. and discharging at a high frequency (13.56 MHZ) power density of 0.5 to 0.8 W/cm$^2$. When the silicon oxynitride film is used, a silicon oxynitride film formed from SiH$_4$, NH$_3$ and N$_2$O by plasma CVD or a silicon oxynitride film formed from SiH$_4$ and N$_2$O by plasma CVD may be formed. The deposition condition in this case is the reaction pressure of 20 to 200 Pa, the substrate temperature of 300 to 400° C., and the high frequency (60 MHZ) power density of 0.1 to 1.0 W/cm$^2$. The hydrogenated silicon oxynitride film formed from SiH$_4$, N$_2$O and H$_2$ may be used, as well. The silicon nitride film can be formed similarly from SiH$_4$ and NH$_3$ by plasma CVD.

Figure 3B:
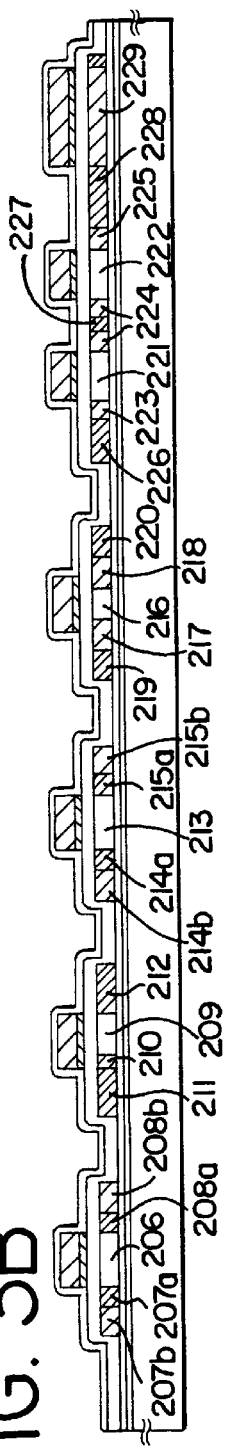

Thereafter, the step for activating the impurity elements imparting n-type or p-type added in the respective concentrations is conducted. This step is conducted by a thermal annealing method using a furnace annealing oven. Besides the thermal annealing method, it is possible to employ a laser annealing method and a rapid thermal annealing method (RTA method). The thermal annealing method is conducted in a nitrogen atmosphere containing oxygen in a concentration of 1 ppm or below, preferably 0.1 ppm or below, at 400 to 700° C., typically 500 to 600° C. In this embodiment, the heat-treatment is conducted at 550° C. for 4 hours. When a plastic substrate having a low heat-resistant temperature is used for the substrate 101, the laser annealing method is preferably employed (FIG. 3B).

After the activation step, heat-treatment was further conducted in an atmosphere containing 3 to 100% at 300 to 450° C. for 1 to 12 hours to hydrogenate the island semiconductor films. This is the process step that terminates the dangling bonds of $10^{16}$ to $10^{18}$/cm$^3$ in the island semiconductor film by hydrogen that is thermally excited. Plasma hydrogenation (using hydrogen that is excited by plasma) may be used as another means for hydrogenation.

Figure 3C:
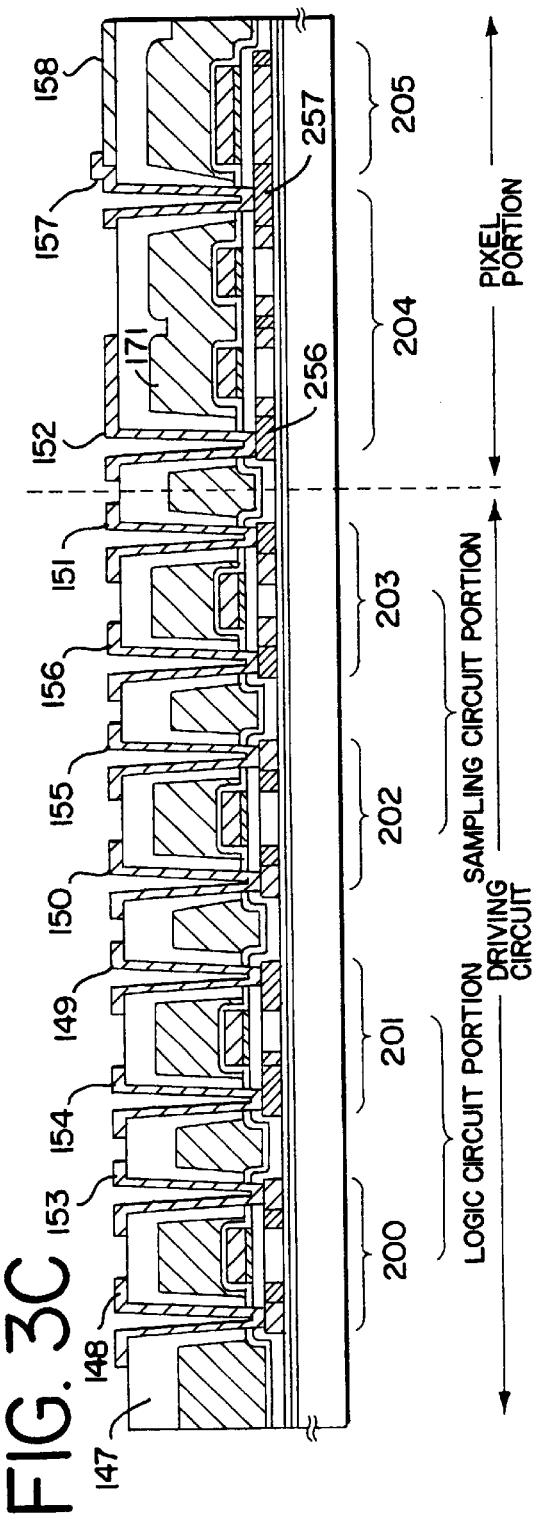

After the activation and hydrogenation steps are completed, the color filter 171 is formed contacting the above mentioned protective insulating film. As a color filter, acrylic resin containing carbon (Fuji film orlin's product) is used to a thickness of 1 to 2 μm. In FIG. 3C, the red color filter is only shown, the blue color filter and the green color filter are formed by predetermined display and formation properly. In this embodiment, the color filter has a formation of shown in FIG. 6. The color filter is preferable to be patterned by dry etching, because it is a minute structure. Three kinds of color filters are obtained here by three times patterning. The pixel electrode which is formed after, and the color filters where is formed a contact hole to connect the pixel TFT are eliminated here.

Next, an interlayer insulating film 147 made of an organic insulating material is formed to a mean thickness of 1.0 to 2.0 μm. Examples of the organic resin materials are polyimide, acrylic, polyamide, polyimidamide, BCB (benzocyclobutene), and so forth. When polyimide of the type, which is thermally polymerized after being applied to the substrate, is used, the material is baked at 300° C. in a clean oven. When acrylic is used, a two-component type is used. After the main agent and the curing agent are mixed, the mixture is applied to the entire surface of the substrate by using a spinner. Preparatory heating is then conducted by using a hot plate at 80° C. for 60 seconds, and baking is then made in the clean oven at 250° C. for 60 minutes.

By forming the interlayer insulating film from the organic insulating material, its surface can be planarized satisfactorily. The organic resin materials have generally a low dielectric constant, and the parasitic capacitance can be reduced. However, since they are hygroscopic, they are not suitable for the protective film. Therefore, the organic insulating material must be used in combination with the silicon oxide film, the silicon oxide nitride film or the silicon nitride film formed as the protective insulating film 146 as in this embodiment.

Next, the transparent conductive film is formed on the entire surface, and the pixel electrode 158 is formed by patterning using a photo-mask.

Materials such as indium oxide (In$_2$O$_3$), or an indium oxide/tin oxide alloy (In$_2$O$_3$—SnO$_2$:ITO) formed by sputtering or vacuum evaporation may be used as materials for the transparent conductive film. The etching treatment of this type of material is performed with hydrochloric acid solutions. However, in particular, the etching of ITO readily generates residues. Therefore, an indium oxide/zinc oxide alloy ($In_2O_3$—ZnO) may be used in order to improve the etching workability. The indium oxide/zinc oxide alloy has excellent flat and smooth surface properties, and also has excellent thermal stability in regards to ITO. Accordingly, at an edge surface of a drain wiring 157 where the Al film comes into contact with the pixel electrode 158, corrosion reaction with Al can be prevented. Similarly, zinc oxide (ZnO) is also a suitable material. In order to further improve the transmissivity of visible light and conductivity, zinc oxide doped with gallium (Ga) (ZnO:G), etc. may be used.

Thereafter, a resist mask having a prescribed pattern is formed by using a photo-mask, and contact holes reaching the source or drain regions of the respective island semiconductor films are formed. The contact holes are formed by dry etching. In this case, a mixed gas of $CF_4$, $O_2$ and He is used as the etching gas to first etch the interlayer insulating film formed of the organic resin material. The protective insulation film 146 is then etched with etching gases of $CF_4$ and $O_2$. By switching the etching gas further to $CHF_3$ to improve the selection ratio with the island semiconductor layers, the gate insulating film is etched and the contact holes can be formed satisfactorily. Further, this embodiment shows an example which indicates that an interlayer insulating film is patterned after performed regular bake (FIG. 4A). The method is also can be taken that patterning is performed after temporary bake, and after that regular bake is performed to smooth the edge as shown in FIG. 4C for forming the wiring 257.

A conductive metal film is formed by sputtering or vacuum deposition. A resist mask pattern is then formed by using a photo-mask. Source wirings 148 to 152 and drain wirings 153 to 157 are formed by etching. Here, the drain wiring 157 provides an overlapping region with the pixel electrode 158, and forms connection structure. As shown in the FIG. 4A and FIG. 4B, in this embodiment, a drain wiring 157 is formed with Ti film 157a that is formed into 50 to 150 nm thickness, a contact is formed with the semiconductor film that forms source or drain region in the island semiconductor layer, and aluminum (Al) 157b is formed to a thickness of 300 to 400 nm in superposition with the Ti film to give this wiring.

When the hydrogenation treatment is conducted under this state, favorable results can be obtained for the improvement of TFT performance. For example, the heat-treatment is conducted preferably at 300 to 450° C. for 1 to 12 hours in an atmosphere containing 3 to 100% of hydrogen. A similar effect can be obtained by using the plasma hydrogenation method. Such a heat-treatment can diffuse hydrogen existing in the protective insulating film 146 and the base film 102 into the island semiconductor films 104 to 108 and can hydrogenate these films. In any case, the defect density in the island semiconductor films 104 to 108 is lowered preferably to $10^{16}/cm^3$ or below, and for this purpose, hydrogen may be added in an amount of about 0.01 to about 0.1 atomic % (FIG. 3C).

Thus a substrate having the TFTs of the driving circuit and the pixel TFTs of the pixel section over the same substrate can be completed. The first p-channel TFT 200, the first n-channel TFT 201, the second p-channel TFT 202 and the second n-channel TFT 203 are formed in the driving circuit. The pixel TFT 204 and the storage capacitance 205 are formed in the pixel section. In this specification, such a substrate will be referred to as an active matrix substrate for convenience sake.

The first p-channel TFT 200 in the driving circuit has a single drain structure, which has in the island semiconductor film 104: the channel formation region 206; and the source regions 207a and 207b and the drain regions 208a and 208b each comprising the p-type impurity region having the high concentration. The first n-channel TFT 201 has in the island semiconductor film 105: the channel forming region 209; the LDD region 210 that partly overlaps with the gate electrode 119; and the source region 212 and the drain region 211. The LDD region that overlaps the gate electrode 119 is referred to as Lov here, and the length of this region in the direction of the channel length is 0.5 to 3.0 μm, preferably 1.0 to 2.0 μm. As the length of the LDD region in the n-channel TFT is determined in this way, a high electric field generated in the proximity of the drain region can be mitigated, and the occurrence of hot carriers and degradation of the TFT can be prevented. The second p-channel TFT 202 in the driving circuit has similarly the single drain structure including the channel forming region 213, the source regions 214a and 214b and the drain regions 215a and 215b comprising the p-type impurity region having the high concentration, in the island semiconductor film 106. A channel forming region 216; LDD regions 217 and 218 that partly overlap the gate electrode 121; and a source region 220 and a drain region 219; are formed in the island semiconductor film 107 in the second n-channel TFT 203. The length of the Lov that partly overlaps the gate electrode of this TFT, too, is also set to 0.5 to 3.0 μm, preferably from 1.0 to 2.0 μm. Further, a LDD region that does not overlap the gate electrode is referred to as an Loff region, and its length in the channel length direction is 0.5 to 4.0 μm, preferably 1.0 to 2.0 μm. The pixel TFT 204 has in the island semiconductor film 108: channel forming regions 221 to 222; and LDD regions 223 to 225; and source or drain regions 226 to 228. The length of the LDD region (Loff) in the direction of the channel length is 0.5 to 4.0 μm, preferably 1.5 to 2.5 μm. Furthermore, a storage capacitance 205 comprises a capacitance wiring 123, an insulating film made of the same material as the gate insulating film and a semiconductor layer 229 that is connected to the drain region 228 of the pixel TFT 204. In FIG. 3C, the pixel TFT 204 is shown as having a double gate structure. However, it may have a single gate structure or a multi-gate structure having a plurality of gate electrodes.

The construction described above makes it possible to optimize the structure of the TFT constituting each circuit in accordance with the specification required by the pixel TFT and the driving circuit, and to improve operation performance and reliability of the semiconductor device. Furthermore, this construction makes it easy to activate the LDD region, the source region and the drain region by forming the gate electrode by a conductive material having heat resistance.

[Embodiment 2]

In this embodiment, the forming method of a pixel electrode is shown, which is different from that of Embodiment 1. Same marks as Embodiment 1 are used, because all structure are same as Embodiment 1 other than overlapping portion of the pixel electrode in pixel portion and the drain wiring.

FIG. 5A shows a cross sectional structure in the pixel portion. In this embodiment, after forming the contact hole on the interlayer insulating film, the drain wiring 357 is formed which is composed of a compound layer; Ti film 357a, Al film 357b and Ti film 357c. And the pixel electrode 358 is formed to be composed a portion of the wiring.

[Embodiment 3]

To accomplish a high-precision and high-quality liquid crystal display device, the characteristics of the TFT constituting the each circuit of the pixel TFT and the driving circuit must be improved. One of the required TFT characteristics is the decrease of the current flowing under the OFF state (OFF current) besides the threshold voltage, the field effect mobility, the sub-threshold coefficient (S value), and so forth. When the OFF current value is high, not only the power consumption increases, but also the operation characteristics of the driving circuit get deteriorated and may invite the drop of image quality. In the n-channel TFT fabricated in Embodiment 1, the LDD region is formed, and this LDD region can lower the OFF current value to the extent that renders no problem. On the other hand, since the p-channel TFT has the single drain structure, the increase of the OFF current value often becomes the problem. This embodiment provides a method of fabricating a p-channel TFT having an offset region suitable to cope with such a problem, by referring to FIG. 8.

The process steps shown in FIGS. 1A to 2A are conducted first in the same way as in Embodiment 1, and the gate electrodes 118 to 122 and the capacitance wiring 123 are formed. Next, the step of adding the impurity element imparting n-type (n⁻ doping step) is conducted to form the LDD region in the n-channel TFT. Here, the impurity element imparting n-type is added by self-alignment using a gate electrodes a mask. In this case, by using a photo-mask, the entire surface of island semiconductor layers 104 and 106, on which the p-channel TFT is to be formed, is covered with resist masks 158 and 159 so that the impurity element is not added to these areas. In this way, the n-type impurity regions 125 to 129 having the low concentration are formed in the island semiconductor layers as shown in FIG. 8A.

Next, in the n-channel TFT, an n-type impurity region having the high concentration that functions as the source or drain region is formed. Resist masks 130 to 134 are formed by using a photo-mask, and an impurity element imparting n-type is added to form n-type impurity regions 135 to 140 having the high concentration (FIG. 8B).

Thereafter, a protective insulating layer 146 is formed in the same way as in Embodiment 1. P-type impurity regions 144 and 145 having the high concentration to serve as the source and drain regions are formed in the island semiconductor layers 104 and 106 that constitute the p-channel TFT. Resist masks 160 to 162 are formed by using the photo-mask to cover the entire surface of the island semiconductor films 105, 107 and 108 that constitute the n-channel TFTs. This step is conducted by ion doping. The impurity element doped has slight fluctuation but is incident substantially vertically to the surface of the island semiconductor layers. The protective insulating layer 146 is formed with good coverage even at the end portion of the gate electrode. Therefore, the protective insulating layer formed at the end portion serves as a mask, and p-type impurity regions 144 and 145 having the high concentration are formed in the spaced-apart relation from the gate electrode by the distance corresponding to the film thickness of the protective insulating layer. In other words, offset regions 230 and 231 are formed to a length $L_0$ between the channel forming region and the p-type impurity region having the high concentration. More concretely, since the length $L_0$ corresponds to the thickness of the protective insulating layer 146, it is formed to a length of 100 to 200 nm (FIG. 8C).

Such an offset region contributes as a series resistance component to the electric characteristics of the TFT, and can reduce the OFF current value by about 1/10 to 1/100. Subsequently the process steps from FIG. 3A are carried out in the same way as in Embodiment 1 and then an active matrix substrate can be completed.

Also, this embodiment can be combined with Embodiment 2.

[Embodiment 4]

This embodiment shows another method of fabricating the crystalline semiconductor layer for forming the active layer of the TFTs of the active matrix substrate described in Embodiments 1 through 3. In this embodiment, the crystallization method using a catalytic element, that is disclosed in Japanese Patent Application Laid-Open No. 7-130652, can be applied. An example of this case will be explained with reference to FIG. 9.

Figure 9A:
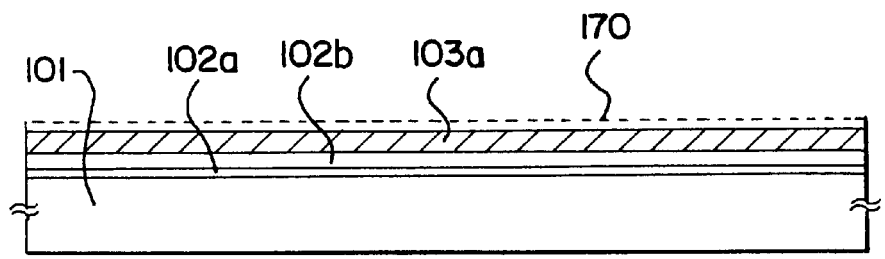
FIGS. 9A to 9C are diagrams showing a process of manufacturing an active matrix substrate (Embodiment 4)

Base films 102a and 102b and an amorphous semiconductor layer 103a to a thickness of 25 to 80 nm are formed over a glass substrate 101 in the same way as in Embodiment 1, as shown in FIG. 9A. An amorphous silicon film, for example, is formed to a thickness of 55 nm. An aqueous solution containing 10 ppm, calculated by weight, of a catalytic element is applied by a spin coating method to form a layer 170 containing the catalytic element. Examples of the catalytic element include nickel (Ni), germanium (Ge), iron (Fe), palladium (Pd), tin (Sn), lead (Pb), cobalt (Co), platinum (Pt), copper (Cu) and gold (Au). Besides spin coating, the layer 170 containing the catalytic element may be formed by sputtering or vacuum evaporation so that the thickness of the layer of the catalytic element is 1 to 5 nm.

Figure 9B:
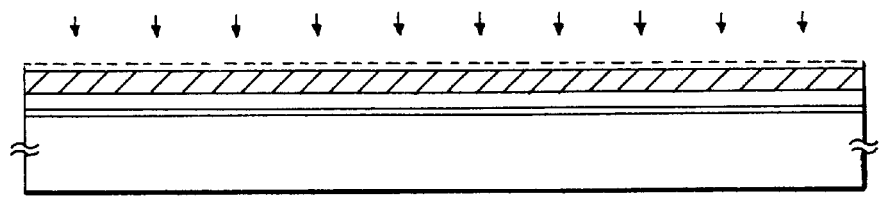
Figure 9C:
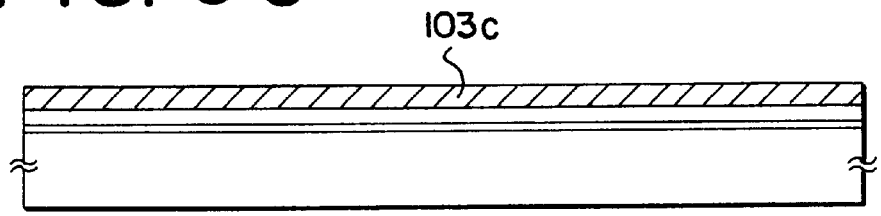

In the crystallization step shown in FIG. 9B, heat treatment is conducted first at 400 to 500° C. for about 1 hour and the hydrogen content of the amorphous silicon film is lowered to not greater than 5 atom %. Thermal annealing is then conducted in a nitrogen atmosphere at 550 to 600° C. for 1 to 8 hours by using a furnace annealing oven. This process step can acquire a crystalline silicon layer 103c comprising the crystalline silicon film (FIG. 9C).

An active matrix substrate can be completed similarly to Embodiment 1 when island semiconductor layers 104 to 108 are manufactured from thus formed crystalline semiconductor film 103c. However, in case of using a catalyst element that promotes crystallization of silicon in the crystallization step, a trace amount (approximately $1 \times 10^{17}$ to $1 \times 10^{19}$ atoms/cm³) of catalyst element remained in the island semiconductor layers. Though it is possible to complete TFTs in such a state, it was more preferable to remove the remained catalytic elements at least from the channel forming regions. There is a means using gettering effect by phosphorus (P) to remove the catalytic element.

Figure 10:
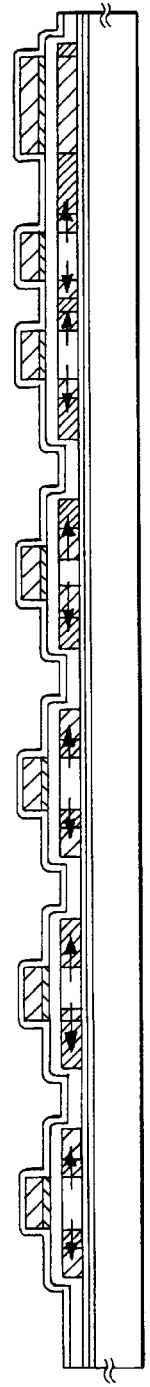
FIG. 10 is a diagram showing a process of manufacturing an AM-LCD (Embodiment 4)

A gettering treatment with phosphorus (P) for this purpose can be conducted simultaneously with the activation step explained in FIG. 3B. This process step is shown in FIG. 10. The concentration of phosphorus (P) necessary for gettering may be approximately the same as the impurity concentration of the n-type impurity region having the high concentration. Thermal annealing of the activation step can make the catalytic element to segregate from the channel formation region of the n-channel TFT and the p-channel TFT to the impurity region containing phosphorus (P) in that concentration (in the direction indicated by an arrow in FIG. 10). As a result, the catalytic element segregates in a concentration of $1 \times 10^{17}$ to $1 \times 10^{19}$ atoms/cm³ in the impurity region. The TFT thus fabricated has a lowered OFF current value and has high crystallinity. Therefore, high field effect mobility can be obtained, and excellent characteristics can be accomplished.

[Embodiment 5]

Figure 11:
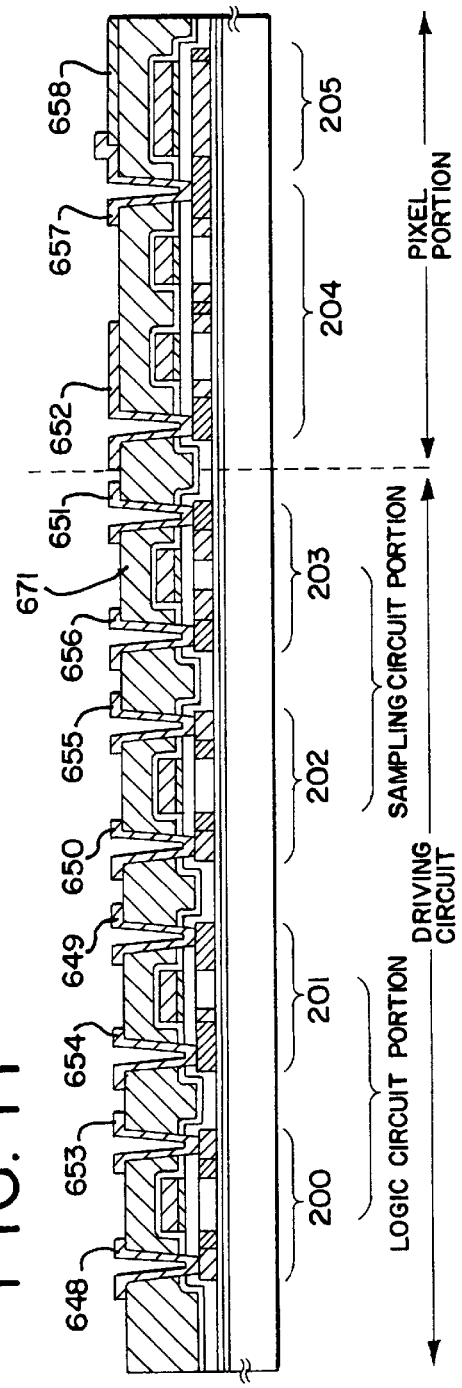
FIG. 11 is a diagram showing an example of a cross sectional structure of an active matrix substrate (Embodiment 5)

In this embodiment, an active matrix substrate is shown using FIG. 11, which has a different structure from that of Embodiment 1. The present invention is an example which is using a color filter as an interlayer insulating film. This embodiment is same as steps shown in figures from the beginning to FIG. 3B in Embodiment 1.

First, the state of FIG. 3B is obtained according to Embodiment 1. Next, the color filter 671 is formed to contact onto the protective insulating film same as Embodiment 1. The color filter having high flatness is used in this embodiment. The pixel electrode 658 from transparent conductive film is formed on the color filter. And the contact hole is formed after the color filter 671, the protective insulating film and the gate insulating film are eliminated selectively. The wirings 648 to 657 is formed and then overlapping region to pixel electrode 658 is formed. Subsequent steps can be according to Embodiment 1.

[Embodiment 6]

Embodiment 1 showed the example that uses the heat-resistant conductive material such as W and Ta for the gate electrode. The reason why such materials are used is because the impurity elements that are added mainly for valency control are activated by thermal annealing at 400 to 700° C. after the gate electrode is formed. However, such heat-resistant conductive material has the sheet resistivity of about 10 Ω and are not suitable for a liquid crystal display device having a screen size of 4 inches or more. When the gate wiring connected to the gate electrode is made of the same material, the length of the lead wire on the substrate becomes essentially great, and the wiring delay resulting from the influence of the wiring resistance cannot be neglected.

This embodiment explains the method of accomplishing such a liquid crystal display device by using low resistance conductive materials such as Al or Cu (copper) for the gate wirings with reference to FIG. 12.

First, the process steps shown in FIGS. 1A to 2D are conducted in the same way as in Embodiment 1. Next, the step for activating the impurity elements added to the respective island semiconductor layer for valency control is performed. This step is carried out by the thermal annealing method using the furnace annealing oven. The laser annealing method or the rapid thermal annealing method (RTA method) can be employed besides the thermal annealing method. This thermal annealing method is conducted in a nitrogen atmosphere having an oxygen concentration of 1 ppm or below, preferably 0.1 ppm or below, at 400 to 700° C., typically at 500 to 600° C. In this embodiment, the heat-treatment is conducted at 525° C. for 4 hours.

In this heat-treatment, conductive layers (C) 118$c$ to 123$c$ are formed to a thickness of 5 to 80 nm from the surface on the conductive layers (B) 118$b$ to 123$b$ forming the gate electrodes 118 to 122 and the capacitance wiring 123. When the conductive layers (B) 118$b$ to 123$b$ are made of tungsten (W), for example, tungsten nitride (WN) is formed and when they are made of tantalum (Ta), tantalum nitride (TaN) is formed. The conductor layers (C) 118$c$ to 123$c$ can be formed similarly by exposing the gate electrodes 118 to 123 to a plasma atmosphere containing nitrogen, such as nitrogen or ammonia. The heat-treatment is carried out further in an atmosphere containing 3 to 100% hydrogen at 300 to 450° C. for 1 to 12 hours to hydrogenate the island semiconductor layers (FIG. 12A).

After the activation and hydrogenation steps are completed, the gate wirings are made of the low resistance conductive material. The low resistance conductive layer is formed of a conductive layer (D) containing Al or Cu as the principal component. For example, an Al film containing 0.1 to 2 wt % of Ti is formed as the conductor layer (D) on the entire surface (not shown in the drawing). The thickness of the conductive layer (D) is 200 to 400 nm (preferably, 250 to 350 nm). Predetermined resist patterns are formed using a photo-mask and etching is conducted to form the gate wirings 163 and 164 and the capacitance wiring 165. This etching is made by wet etching using a phosphoric acid type etching solution. A protective insulating film 146 is then formed (FIG. 12B).

Figure 13A:
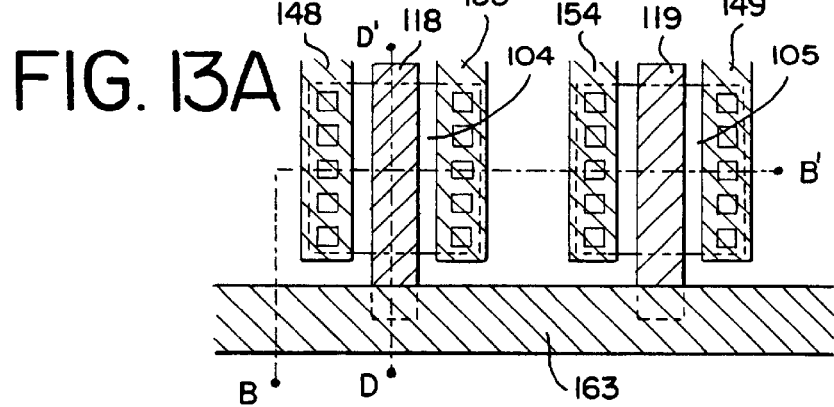
FIGS. 13A and 13B are diagrams showing a structure of the active matrix substrate (Embodiment 6)
Figure 13B:
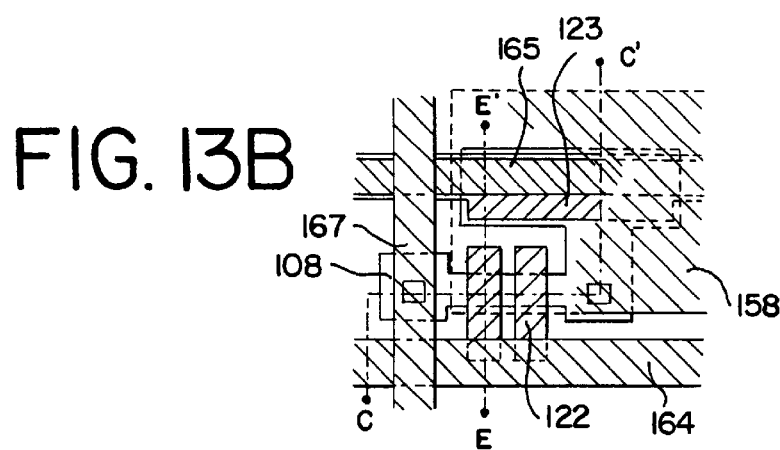
Figure 14A:
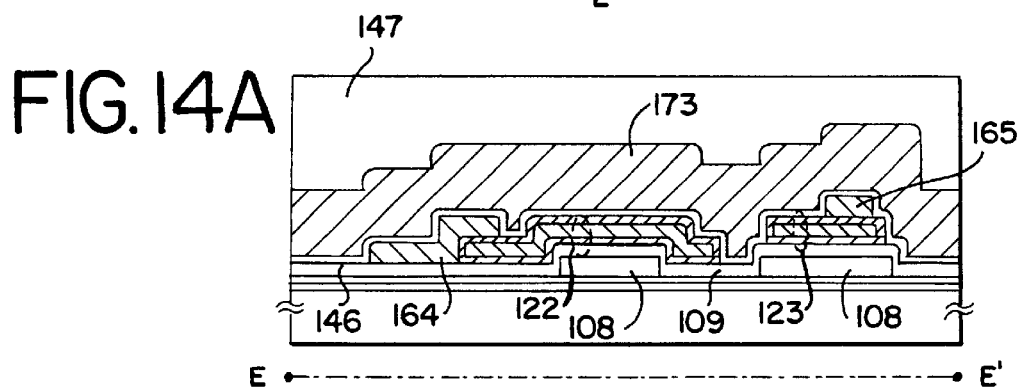
FIGS. 14A and 14B are diagrams showing a structure of the active matrix substrate (Embodiment 6)
Figure 14B:
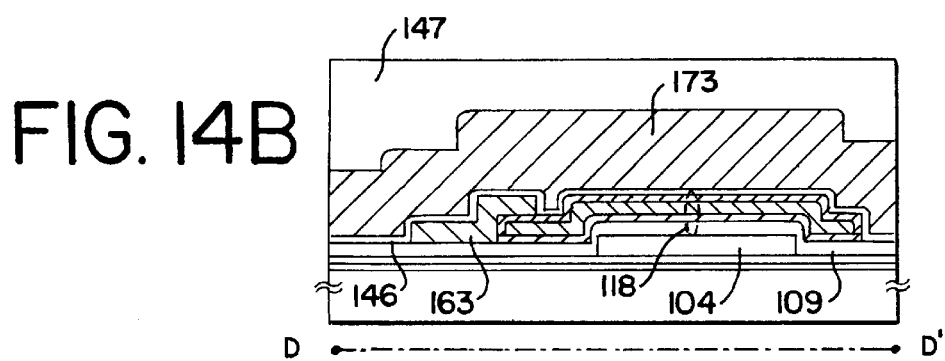

A color filter 173, an interlayer insulating film 147 made of an organic insulating material, s pixel electrode 158, source wirings 148 to 152 and drain wirings 153 to 157 are formed in the same way as in Embodiment 1. An active matrix substrate can be thus completed. FIGS. 13A and 13B are top views of this state. The B–B' section of FIG. 13A and the C–C' section of FIG. 13B correspond to B–B' and C–C' of FIG. 12C, respectively. The gate insulating film, the protective insulating film, the color filter and the interlayer insulating film are omitted in FIGS. 13A and 13B. The E–E' section of FIG. 13B and the D–D' section of FIG. 13A are shown in FIGS. 14A and 14B, respectively. The gate wiring 163 and 164 are formed in such a fashion that the former 163 overlaps with the gate electrodes 118 and 119 and the latter 164, with the gate electrode 122, outside the island semiconductor layers 104, 105 and 108, respectively. The conductor layer (C) and the conductor layer (D) are in contact, and connected electrically. In this way, the wiring resistance can be lowered sufficiently by forming the gate wiring from the low resistance conductive material. Therefore, this embodiment can be applied to the display device having the pixel section (screen size) of the 4-inch class or larger.

[Embodiment 7]

This embodiment explains the manufacturing steps of an active matrix liquid crystal display device from the active matrix substrate manufactured in Embodiment 1.

Figure 15:
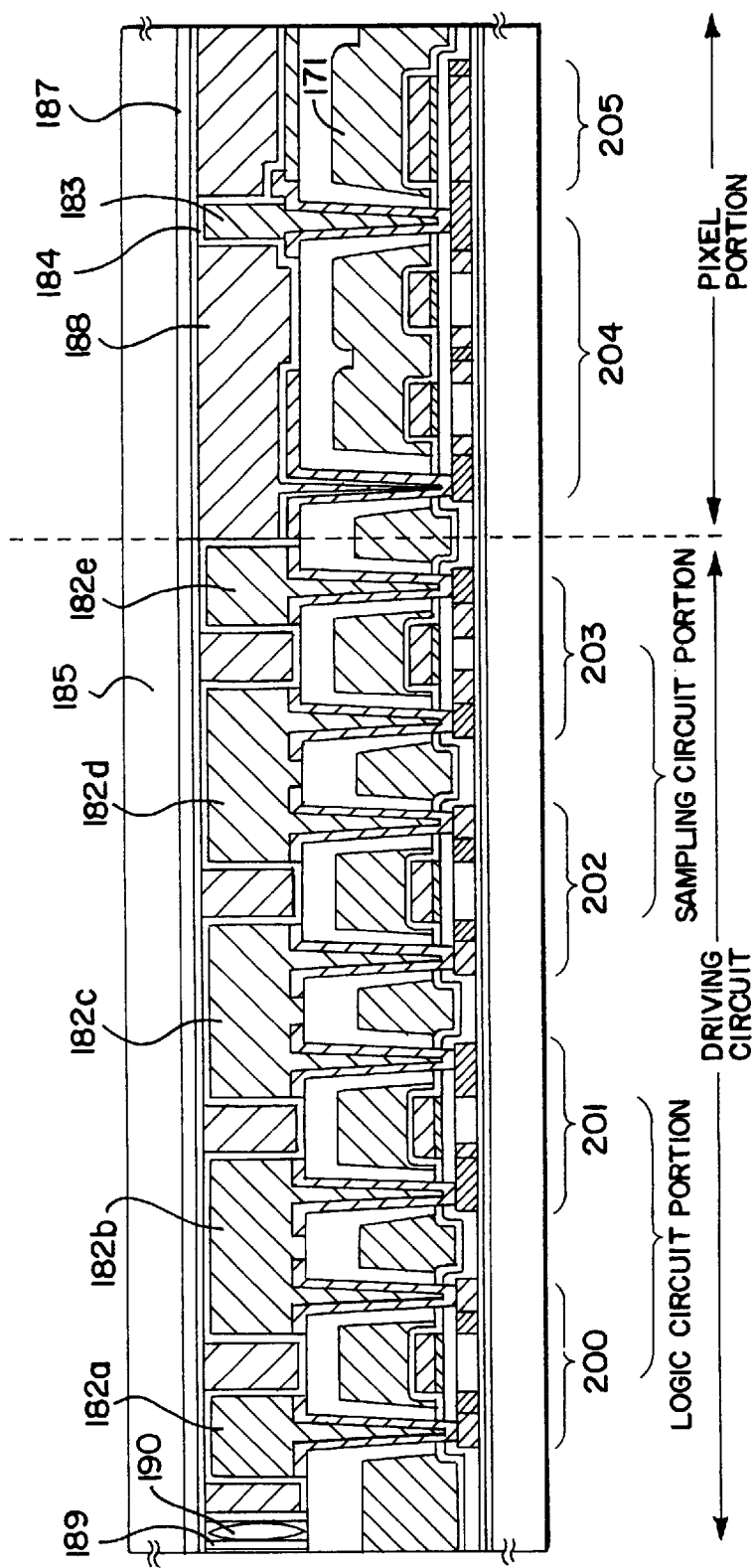
FIG. 15 is a cross sectional structure diagram of an active matrix liquid crystal display device (Embodiment 7)

First, as shown in FIG. 15A, a spacer comprising a columnar spacer is formed on the active matrix substrate under the state shown in FIG. 3C. The material of the spacer is not limited, in particular. For example they may be formed by using "NN700" of JSR Co., and after the material is coated by a spinner, a prescribed pattern is formed by exposure and development. The pattern is then heated and cured at 150 to 200° C. in a clean oven, or the like.

Thereafter, the alignment film 184 is formed. A polyimide resin is used generally for the alignment film of the liquid crystal display element. After the alignment film is formed, rubbing treatment is conducted so that the liquid crystal molecules are oriented with a certain pre-tilt angle. The occurrence of static electricity often becomes the problem during the rubbing treatment. When the spacer 182 is formed over the TFT of the driving circuit, too, both original role as the spacer and the protection effect of the TFT from static electricity can be acquired.

A transparent conductive film 187 and an alignment film 188 are formed on an opposing substrate 185 on the opposite side. The active matrix substrate on which the pixel section and the driving circuit are formed and the opposing substrate are bonded to each other through a sealant 189. A filler 190 is mixed in the sealant 189. These two substrates are bonded together while keeping a uniform gap by the filler 190 and the spacers 182 and 183. Thereafter, a liquid crystal material is injected between both substrates, and the substrates are completely sealed by the sealant (not shown). A known liquid crystal material may be used for the liquid crystal material. In this way, the active matrix liquid crystal display device shown in FIG. 15 can be completed.

[Embodiment 8]

In this embodiment, the shape of gate electrode has a taper shape different from Embodiment 1. An example of forming method by doping using the taper shape is shown in this embodiment.

In this embodiment, the conductive layer (A) is formed from the WN film and the conductive layer (B) is formed from the W film in order to form the gate electrode. Next, resist masks are formed, then the conductive layer (A) and the conductive layer (B) are etched together to form gate electrodes 701 to 705 and a capacitor wiring 706. The gate electrodes 701 to 705 and the capacitor wiring 706 are formed integrally from the conductive layer (A), and from the conductive layer (B).

At this point, the etching is carried out such that at least taper portions are formed at edge portions of the gate electrodes 701 to 705. The ICP etching apparatus is used in this etching process and the details of this technique are as explained above. Etching is performed at the following specific etching conditions: a mixed gas of $CF_4$ and $Cl_2$ is used as the etching gas, their flow rates are set to 30 SCCM, respectively, the electric discharge power is set to 3.2 W/cm² (13.56 MHZ), the bias power is set to 224 mW/cm² (13.56 MHZ), and the reaction pressure is set to 1.0 Pa. In the edge portions of the gate electrodes 118 to 122, taper portions that gradually increase in thickness inwards from the edge portions are formed under such etching conditions. The angles of these taper portions are 5° to 45°, preferably 10° to 30°. An angle of the taper portions greatly influences the concentration gradient of an n-type impurity region having low concentration for forming LDD regions in a later step.

Further, in order to perform etching without leaving any residue, it is appropriate to increase the etching time about 10% to 20% to perform over-etching. However, attention must be paid to the selective ratio of etching with a base film at this point. For example, the selective ratio of the silicon oxynitride film (the gate insulating film) to the W film is between 2 to 4 (typically 3). Due to this type of over-etching process, an exposed surface of the silicon oxynitride film is etched between 20 and 50 nm, becoming substantially thinner, whereby a newly shaped gate insulating film is formed.

The step of doping an impurity element that imparts n-type conductivity (n⁻ dope process) is performed for the purpose of forming an LDD region of the pixel TFT and an n-channel TFT of the driving circuit. Resist masks used for the formation of the gate electrode, are kept intact, and using the gate electrodes 701 to 705 having the taper portion in the edge portion, as masks, an impurity element that imparts n-type conductivity is doped by ion doping in a self-aligning manner. Here in this step, in order to dope the impurity element that imparts n-type conductivity so that it passes through the taper portions in the edge portions of the gate electrodes and through the gate insulating film to reach the semiconductor layer positioned underneath, the dosage is set to between $1\times10^{13}$ and $5\times10^{14}$ atoms/cm³ and the acceleration voltage is set to between 80 and 160 keV. Phosphorus (P) is used here in this step. The concentration of phosphorus of the semiconductor layer is in the concentration range of between $1\times10^{16}$ and $1\times10^{19}$ atoms/cm³ by such ion doping. In this way, n-type impurity regions having low concentrations are thus formed in the island semiconductor layer.

In this step, at least the concentration gradient of phosphorus contained in the portion in the n-type impurity regions having a low concentrations that overlaps the gate electrodes 701 to 705 reflects the change in film thickness of the taper portions of the gate electrodes 701 to 705. In other words, the concentration of phosphorus that is doped into the n-type impurity regions having low concentrations gradually becomes higher towards the edge portion of the gate electrode in the region overlapping the gate electrode. This is because the concentration of phosphorus that has reached the semiconductor layer changes due to the difference in the film thickness of the taper portion.

The formation of n-type impurity regions having high concentrations for functioning as a source region or a drain region in the n-channel TFT is performed next (n⁺ doping process). Resist masks are left as they are, and new resist masks are formed on resist masks by using the third photomask. They are formed so as to cover gate electrodes and a part of island semiconductor layers. Doping is performed by ion doping under a condition of low acceleration voltage of 10 to 30 keV The n-type impurity regions having high concentrations are thus formed. Since the gate insulating film in these regions has been treated with over-etching in the step forming the gate electrodes, the film thickness of the gate insulating film has become thinner to between 70 and 100 nm compared with the initial thickness of 120 nm. Accordingly, phosphorus can be doped appropriately even under such a condition as low acceleration voltage. The concentration of phosphorus in these regions is set so that it is in the concentration range of between $1\times10^{20}$ and $1\times10^{21}$ atoms/cm³.

The p-type impurity region shaving high concentrations are formed next as a source region and a drain region in island semiconductor layers, which form the p-channel TFTs. Here, an impurity element that imparts p-type is doped with the gate electrodes as masks, and the p-type impurity region having high concentrations is formed in a self-aligning manner. At this point, the entire surface of island-like semiconductor layers that form the n-channel TFT is covered by resist masks, which are formed by using a photomask. The impurity regions to be formed here are then formed by ion doping using diborane ($B_2H_6$). Then the boron (B) concentration of the p-type impurity regions having high concentrations that do not overlap with the gate electrode is made to be from $3\times10^{20}$ to $3\times10^{21}$ atoms/cm³. In addition, because an impurity element is doped through the gate insulating film and the taper portion of the gate electrode into the impurity regions that overlap the gate electrode, these regions are substantially formed as a p-type impurity region having low concentrations with the concentration set to at least $1.5\times10^{19}$ atoms/cm³ or more. Since phosphorus (P) has already been doped into the p-type impurity regions having high concentrations, and into the p-type impurity regions having low concentrations in the previous step, the contained concentration of the p-type impurity regions having high concentrations is from $1\times10^{20}$ to $1\times10^{21}$ atoms/cm³ and the contained concentration of the p-type impurity regions having low concentrations is from $1\times10^{16}$ to $1\times10^{19}$ atoms/cm³. The boron (B) concentration to be doped in this step is set to be 1.5 to 3 times that of phosphorus (P). Accordingly, no obstacles of any kind will occur for the p-type impurity regions to function as the source region and the drain region of the p-channel TFT.

After that, according to the steps following FIG. 3A in Embodiment 1, activation, forming protective insulating film, forming color filter and forming first interlayer insulating film can be performed.

Figure 16:
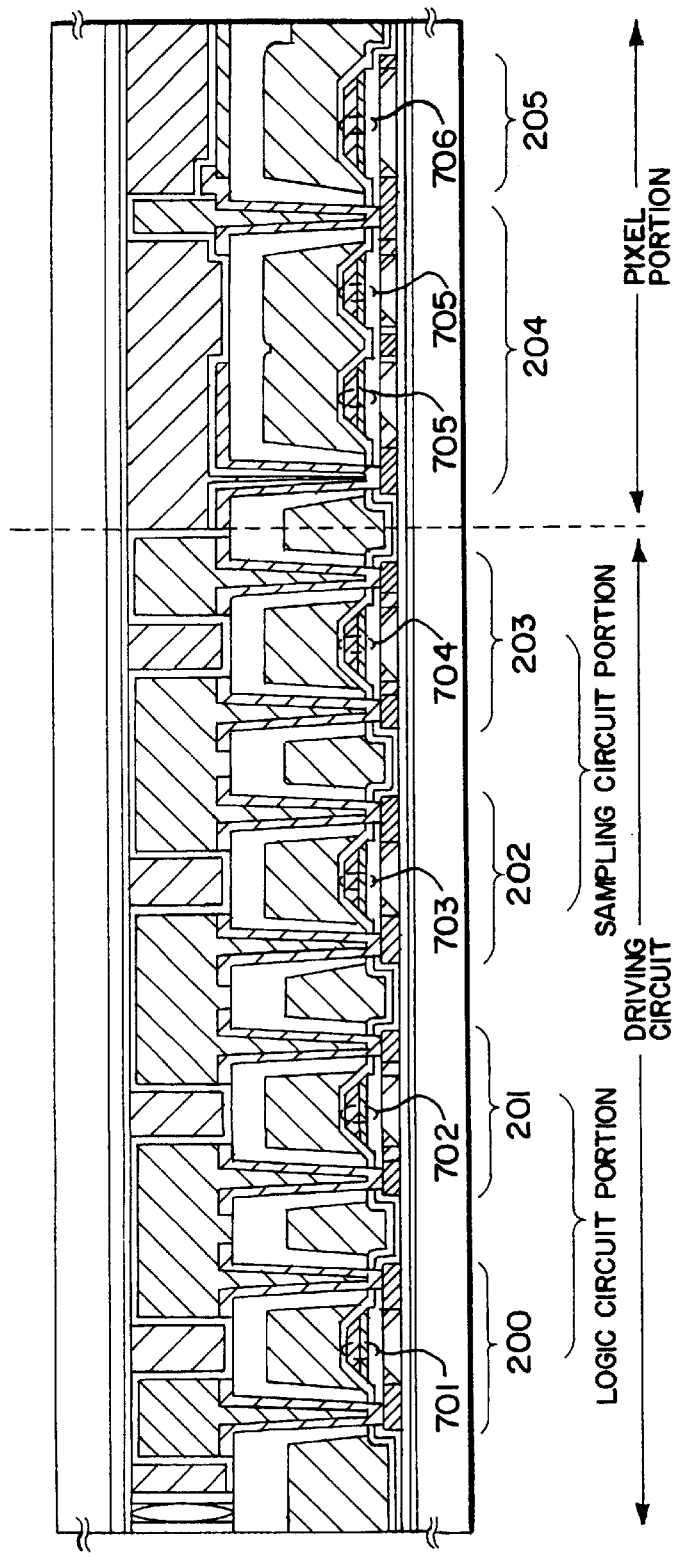
FIG. 16 is cross sectional structure diagram of an active matrix liquid crystal display device (Embodiment 8)

In the following steps, according to Embodiment 1 and Embodiment 7, a liquid crystal display device shown in FIG. 16 is completed.

[Embodiment 9]

An example of using a gate electrode which differs from that of Embodiment 1 is shown in Embodiment 9.

The gate electrode of a TFT shown by Embodiment 9 has a two-layer structure, as shown by Embodiment 1. However, the point that a first layer and a second layer are both formed by an element selected from the group consisting of Ta, W, Ti, and Mo, or from an alloy of, or a chemical compound of, these elements differs from embodiment 1. The most preferable combination is to form the first layer by Ta, tantalum nitride (TaN), or a lamination structure of tantalum nitride (TaN) and Ta, and to form the second layer by W.

First, after forming island shape semiconductor layers similarly to Embodiment 1, a gate insulating film having a thickness of 40 to 150 nm is formed from an insulating film containing silicon by plasma CVD or sputtering.

A first conducting film and a second conducting film are then formed on the gate insulating film in order to form a gate electrode. In Embodiment 9, the first conducting film is formed by Ta at a thickness of 50 to 100 nm, and the second conducting film is formed by W at a thickness of 100 to 300 nm.

The Ta film is formed by sputtering, and sputtering of a Ta target is performed by Ar. In this case, if a proper amount of Xe or Kr is added to Ar, the internal stress of the Ta film is relieved, and peeling of the film can be prevented. Further, an α-phase Ta film has a resistivity on the order of 20 $\mu\Omega$cm, and can be used in the gate electrode, but a β-phase Ta film has a resistivity on the order of 180 $\mu\Omega$cm, and is not suited as the gate electrode. In order to form an α-phase Ta film, if tantalum nitride, which has a crystal structure near that of α-phase Ta, is formed having a thickness of 10 to 50 nm as a base for Ta, an α-phase Ta film can easily be obtained.

The W film is formed by sputtering with a W as a target. In addition, the W film can be formed by thermal CVD using tungsten hexafluoride ($WF_6$). When sputtering is used, by forming the W film using a target having a purity of 99.9999%, and in addition, taking sufficient consideration so that there is no mixing in of impurities within the gas phase during film deposition, a resistivity of 9 to 20 $\mu\Omega$cm can be realized.

A mask is formed next by resist, and a first etching process is performed in order to form the gate electrode. An ICP (inductively coupled plasma) etching device is used in Embodiment 9, and etching is performed using $CF_4$ and $Cl_2$ as etching gasses, at a pressure of 1 Pa, with an RF (13.56 MHZ) power of 500 W from a coil shape electrode, performing plasma generation. A 100 W RF (13.56 MHz) power is input to the substrate side (sample stage) as well, effectively applying a negative self bias voltage. When $CF_4$ and $Cl_2$ are mixed, the W film and the Ta film can be etched at approximately the same rate.

With the above etching conditions, and by using an appropriate shaped resist mask, edge portions of the first conducting layer and the second conducting layer are given a taper shape as a result of a bias voltage applied to the substrate side. The angle of the tapered portion becomes from 15 to 45°. In order to etch without any residue remaining on the gate insulating film, an over-etching process, in which the etching time is increased by a ratio on the order of 10 to 20%, may be performed. The selectivity of the silicon nitride oxide film is from 2 to 4 (typically 3) with respect to the W film, and therefore the silicon nitride oxide film is etched on the exposed surface by approximately 20 to 50 nm due to the over-etching process. A first taper shape conducting layer (the first conducting layer and the second conducting layer) is thus formed from the first conducting layer and the second conducting layer by the first etching process.

A first doping process is then performed and an impurity element which imparts n-type conductivity is added. The doping process may be performed by ion doping or ion injection. In ion doping, the dose amount is set to $1\times10^{13}$ to $5\times10^{14}$ atoms/cm$^2$ and doping is performed with the acceleration voltage set between 60 and 100 keV. An element residing in group 15 of the periodic table, typically phosphorous (P) or arsenic (As), is used as the impurity element for imparting n-type conductivity, and phosphorous (P) is used here. In this case, the conducting layer becomes a mask with respect to the impurity element for imparting n-type conductivity, and a first impurity region is formed in a self-aligning manner. The n-type conductivity imparting impurity element is added to the first impurity region in a concentration range from $1\times10^{20}$ to $1\times10^{21}$ atoms/cm$^3$.

A second etching process is performed next. The ICP etching device is similarly used, $CF_4$, $Cl_2$, and $O_2$ are mixed as the etching gas, and a plasma is generated at a pressure of 1 Pa with 500 W RF power (13.56 MHZ) supplied to a coil type electrode. The substrate side (sample stage) is supplied with 20 W RF (13.56 MHZ) power, a lower self-bias voltage when compared to the first etching process is applied. The W film is selectively and anisotropically etched, and the second conducting layer is made into a first rectangular shape conducting layer. The first taper shape conducting layer remains as is at this point.

The etching reaction of the W film and the Ta film in accordance with $CF_4$ and $Cl_2$ gas can be conjectured from the generated radicals and ions, and from the vapor pressure of the reaction products. When the vapor pressures of fluoride and chloride compounds of W and Ta are compared, the vapor pressure of the W fluoride compound $WF_6$ is extremely high, and the vapor pressures of $WCl_5$, $TaF_5$, and $TaCl_5$ are of the same order. Therefore the W film and the Ta film are both etched by the mixed $CF_4$ and $Cl_2$ gas. However, if $O_2$ is added to this gas mixture, then $CF_4$ and $O_2$ react, becoming CO and F, and a large amount of F radicals or F ions are generated. As a result, the vapor pressure of fluoride compounds is high, and the etching speed of the W film increases. On the other hand, even if F increases, the relative etching speed increase for Ta is small. Further, compared to W, Ta oxidizes easily, and therefore the surface of Ta is oxidized by adding $O_2$. The Ta oxide does not react with fluorine or chlorine, and therefore the etching speed of the Ta film is additionally lowered. A large difference in the etching speeds of the W film and the Ta film develops, and it becomes possible to selectively etch the W film.

A third etching process is performed next. The third etching process is performed at the same conditions as the first etching process, and a third shape conducting layer having a tapered portion at an angle of 15 to 45° is formed. The mask from resist on the conducting layer erodes away at the same as the etching process, and a second taper shape conducting layer (the first conducting layer and the second conducting layer) is formed by the third etching process from the first conducting layer and the second conducting layer.

A fourth etching process is performed from this state. The fourth etching process is performed at the same conditions as the second etching process, the W film is selectively and anisotropically etched, and the second conducting layer is made into a second rectangular shape conducting layer. The second taper shape conducting layer is left as is at this point.

An impurity element which imparts n-type conductivity is then doped at high acceleration voltage conditions and with a dose amount that is made lower than that of the first doping process. For example, the acceleration voltage is set from 70 to 120 keV, and doping is performed at a dose amount of $1\times10^{13}$/cm$^2$, and a new impurity region is formed in a region on the inside of the first impurity region formed in the island shape semiconductor layers. The doping is performed using the second rectangular shape conducting layer as a mask with respect to the impurity element, and the doping conditions used as such that the impurity element is also added to a region on the underside of the second tapered shape conducting layer. A third impurity region overlapping the second taper shape conducting layer, and a second impurity region between the first impurity region and the third impurity region are therefore formed. An n-type conductivity imparting impurity element is added so that the concentration in the second impurity region becomes from $1\times10^{17}$ to $1\times10^{19}$ atoms/cm$^3$, and the concentration in the third impurity region becomes from $1\times10^{16}$ to $1\times10^{18}$ atoms/cm$^3$.

A fourth impurity region is then formed having a conductivity which is the opposite of the single conductivity type in the island shape semiconductor layer in which the p-channel TFT is formed. The second rectangular shape conducting layer is used as a mask with respect to impurity elements, and the impurity region is formed in a self-aligning manner. The island shape semiconductor layer in which the n-channel TFT is formed is completely covered by a resist mask at this point. The impurity region is formed by ion doping using diborane ($B_2H_6$). The impurity concentration is set so as to become from $2\times10^{20}$ to $2\times10^{21}$ atoms/cm$^3$.

The impurity regions are formed in the respective island shape semiconductor layers by the processes through to this point. Further, they are made into second rectangular shape conducting layers. The second taper shape conducting layer becomes unified at this point, and functions as gate electrodes 801 to 805. In addition, a capacitor electrode 806 is formed.

Subsequently, processes for activation, and formation of a protecting insulating film, a color filter, and a first interlayer insulating film may be performed in accordance with the steps of Embodiment 1 from FIG. 3A onward.

Figure 17:
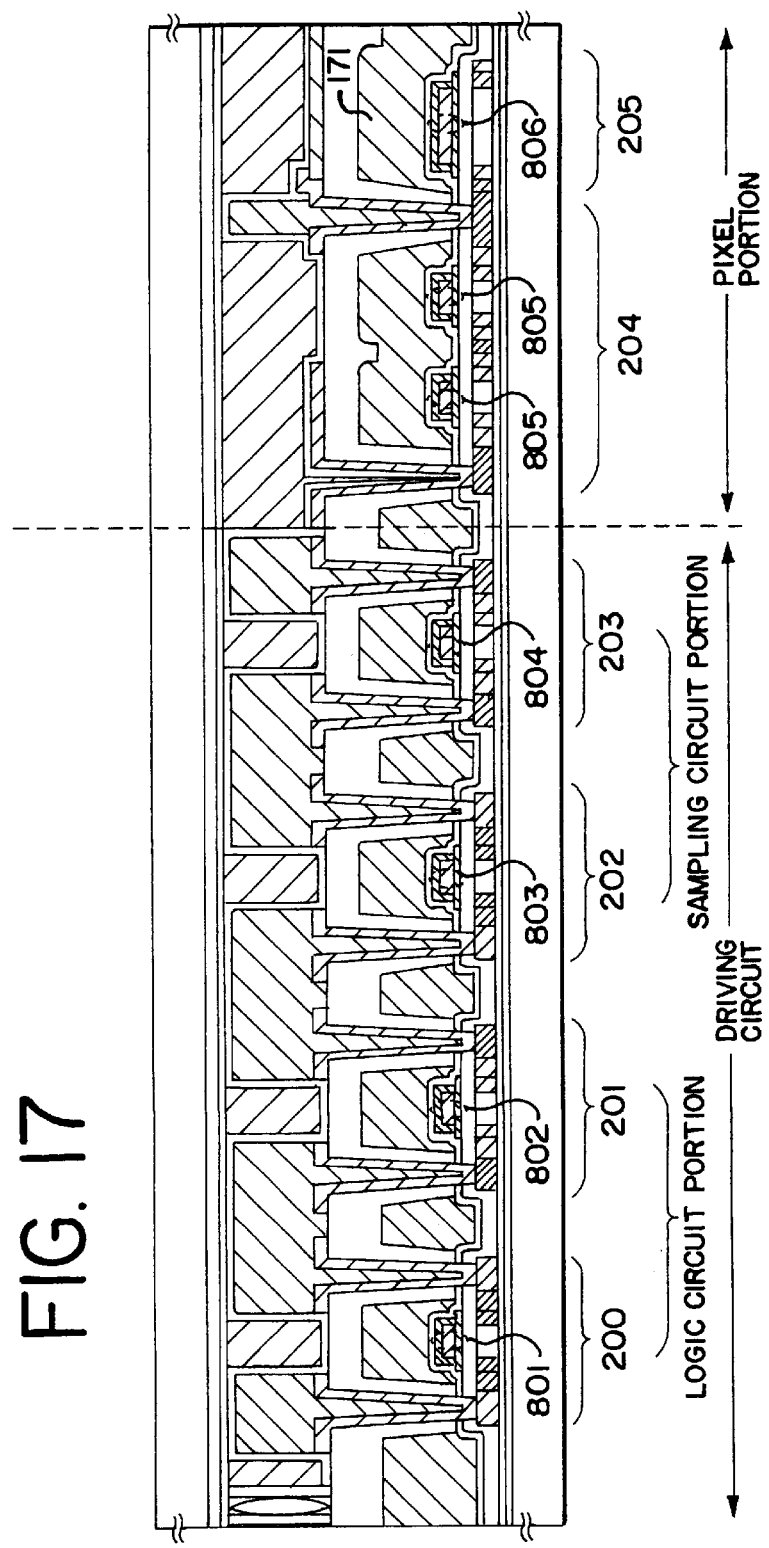
FIG. 17 is a cross sectional structure diagram of an active matrix liquid crystal display device (Embodiment 9)

The liquid crystal display device shown in FIG. 17 is completed, provided that subsequent processes are performed in accordance with Embodiment 1 and Embodiment 7.

[Embodiment 10]

Figure 18:
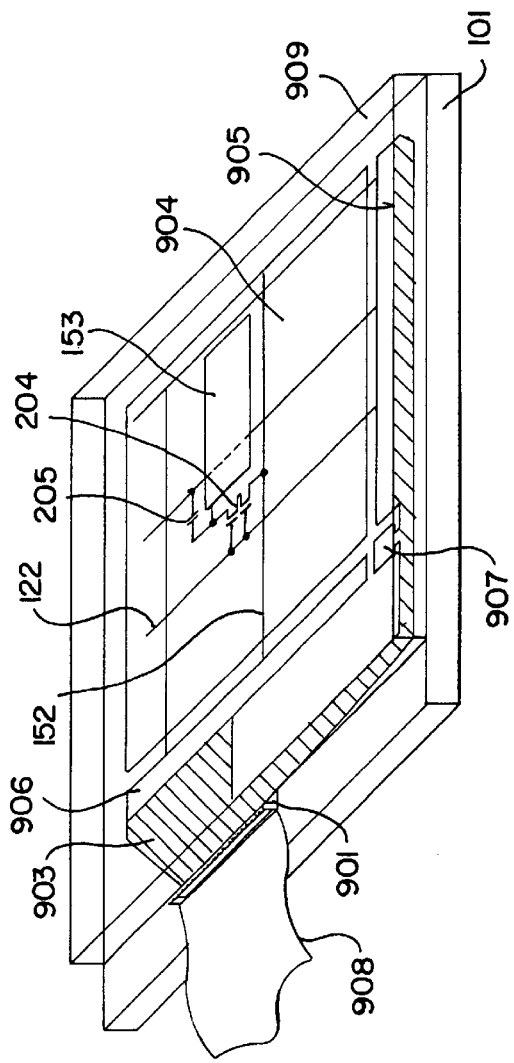
FIG. 18 is a diagram showing an external view of an AM-LCD (Embodiment 10)

The structure of the active matrix liquid crystal display device obtained using Embodiments 7 to 9 is explained using the perspective view of FIG. 18. The active matrix substrate is structured by a pixel portion 904, a scanning signal driving circuit 905, an image signal driving circuit 906, and other signal processing circuits 907, all formed on a glass substrate 101 as in FIG. 18. A pixel TFT 204 and a storage capacitor 205 are formed in the pixel portion 904, and the driving circuits formed in the periphery of the pixel portion are structured with a CMOS circuit as a base. The scanning signal driving circuit 905 and the image signal driving circuit 906 are connected to the pixel TFT 204 by a gate wiring 122 and a source wiring 152, respectively. Further, a flexible printed circuit (FPC) 908 is connected to an external input terminal 902 and used for inputting signals such as an image signal. Connection wirings 903 are connected to each of the driving circuits. Furthermore, a light shielding film or a transparent electrode is formed in an opposing substrate 909, although not shown in the figure.

[Embodiment 11]

Figure 19:
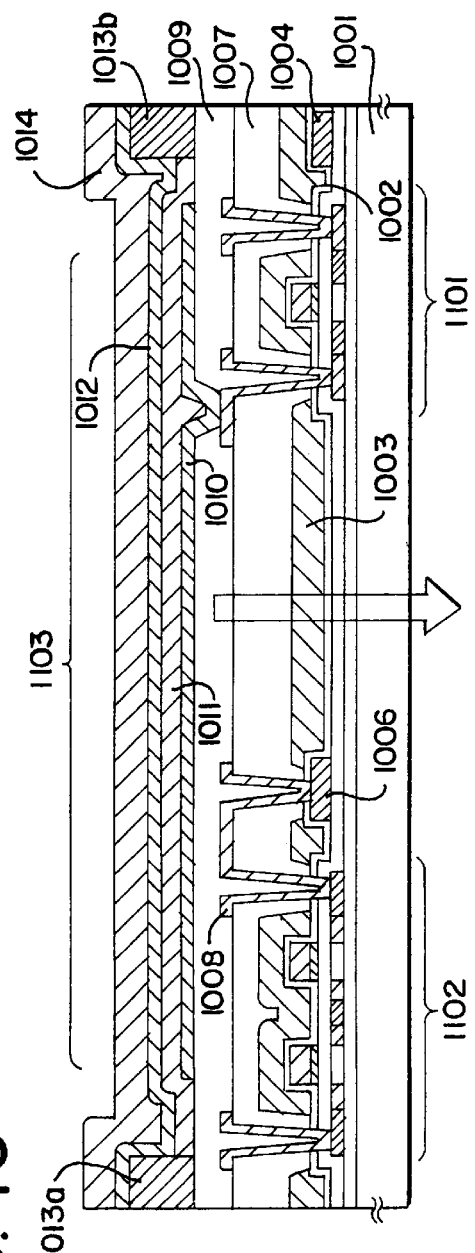
FIG. 19 is a diagram showing a structure of an active matrix EL display device (Embodiment 11)

In Embodiment 11, an example is shown in FIG. 19 of an EL display device manufactured by applying the method of manufacturing an active matrix substrate of Embodiment 1.

In FIG. 19, a switching TFT 1102 formed on a substrate 1001 is manufactured using an n-channel TFT. Embodiment 1 may be referred to regarding the manufacturing process. Note that a double gate structure is used in Embodiment 11, but a single gate structure may also be used, and a multi-gate structure possessing three gates or more may also be used. Further, the p-channel TFT of the present invention may also be used.

An electric current control TFT is manufactured using a p-channel TFT (refer to Embodiment 1). A drain wiring 1008 of the switching TFT 1102 is electrically connected to the gate electrode of the electric current control TFT by wiring 1006 at this point. Further, a wiring denoted by reference numeral 1004 is a gate wiring for electrically connecting a gate electrode of the switching TFT 1102.

The electric current control TFT 1101 is shown by a single gate structure in Embodiment 11, but a multi-gate structure in which a plurality of TFTs are connected in series may also be used. In addition, a structure in which a plurality of TFTs are connected in parallel, effectively dividing the channel forming region into a plurality of channel forming regions and which performs thermal radiation at high efficiency may also be used. This type of structure is effective as a measure against thermal degradation.

A first passivation film 1002 is formed on the switching TFT 1102 and the current control TFT 1101, a color filter 1003 is formed on top, and a leveling film 1009 of a resin insulating film is formed on top of that. It is very important to level the step due to the TFTs using the leveling film 1009. An EL layer formed later is extremely thin, and defects in the emission of light may be caused by the existence of the step. Therefore, to form the EL layer with as level a surface as possible, it is preferable to perform leveling before forming a pixel electrode.

Further, reference numeral 1010 denotes a pixel electrode (EL element anode) made from a conducting film with high reflectivity, and this is electrically connected to the drain of the electric current control TFT 1101. It is preferable to use a transparent conducting film as the pixel electrode 1010. A lamination structure with another conducting film may of course also be used.

Furthermore, a light emitting layer 1011 is formed in the middle of a groove (corresponding to a pixel) formed by banks 1013a and 1013b, which are formed by insulating films (preferably resins). Note that only one pixel is shown in the figure here, but the light emitting layer may be divided to correspond to each of the colors R (red), G (green), and B (blue). A π conjugate polymer material is used as an organic EL material to be a light emitting layer. Polyparaphenylene vinylenes (PPVs), polyvinyl carbazoles (PVKs), and polyfluoranes can be given as typical polymer materials.

Note that there are several types of PPV organic EL materials, and materials recorded in Shenk, H., Becker, H., Gelsen, O., Kluge, E., Kreuder, W., and Spreitzer, H., "Polymers for Light Emitting Diodes", Euro Display, Proceedings, 1999, pp. 33–7, and in Japanese Patent Application Laid-open No. Hei 10-92576, for example, may be used.

Regarding specific light emitting layers, cyanopolyphenylene vinylene may be used as a red color light emitting layer, polyphenylene vinylene may be used as a green color light emitting layer, and polyphenylene vinylene or polyalkylphenylene may be used as a blue color light emitting layer. The film thicknesses may be between 30 and 150 nm (preferably between 40 and 100 nm).

However, the above examples are only examples of the organic EL materials which can be used as light emitting layers, and it is not necessary to limit use to these materials. An EL layer (a layer for performing light emission and carrier motion for light emission) may be formed by freely combining light emitting layers, charge transporting layers, and charge injecting layers.

For example, Embodiment 11 shows an example using polymer materials as light emitting layers, but low molecular weight organic EL materials may also be used. Further, it is possible to use inorganic materials such as silicon carbide as charge carrying layers and charge injecting layers. Known materials can be used for these organic EL materials and inorganic materials.

A white color layer is used as a light emitting layer in embodiment 11. Therefore, when using a material which emits white color light as the light emitting layer, the light emitted from the EL element is irradiated through the substrate, and is colorized by the color filter 1003 formed on the substrate side. Further, when using a material which emits colored light, the color filter 1003 fulfills a role as a filter for increasing color purity. Note that, in Embodiment 11, the TFT is protected from degradation due to light by the formation of the color filter 1003 on the TFT element.

Furthermore, reference numeral 1012 denotes a cathode made from a conducting film having a high reflectivity, and this is formed contacting the light emitting layer. It is preferable to use a low resistance conducting film such as an aluminum alloy film, a copper alloy film, or a silver alloy film, or a lamination film of these films, as the cathode.

An EL element 1103 is complete at the point where the cathode 1012 is formed. Note that the EL element 1103 referred to here indicates a capacitor formed by the pixel electrode (anode) 1010, the light emitting layer 1011, and the cathode 1012.

An additional second passivation film 1014 is then formed on the cathode 1012 in Embodiment 11. It is preferable to use a silicon nitride film or a silicon nitride oxide film as the second passivation film 1014. The reasons for forming the second passivation film is to isolate the EL element from the outside, which means preventing degradation due to oxidation of the organic EL material, and also suppressing outgassing from the organic EL material. The reliability of the EL display device is thus increased.

The EL display panel of the present invention thus has a pixel portion composed of pixels having a structure like that of FIG. 19, and has a switching TFT with a sufficiently low off electric current value, and an electric current control TFT which is strong with respect to hot carrier injection. Therefore it has high reliability, and an EL display panel capable of good pixel display can be obtained.

Note that it is possible to implement the constitution of embodiment 11 by freely combining with the constitution of any of Embodiments 1 to 6.

[Embodiment 12]

Figure 20:
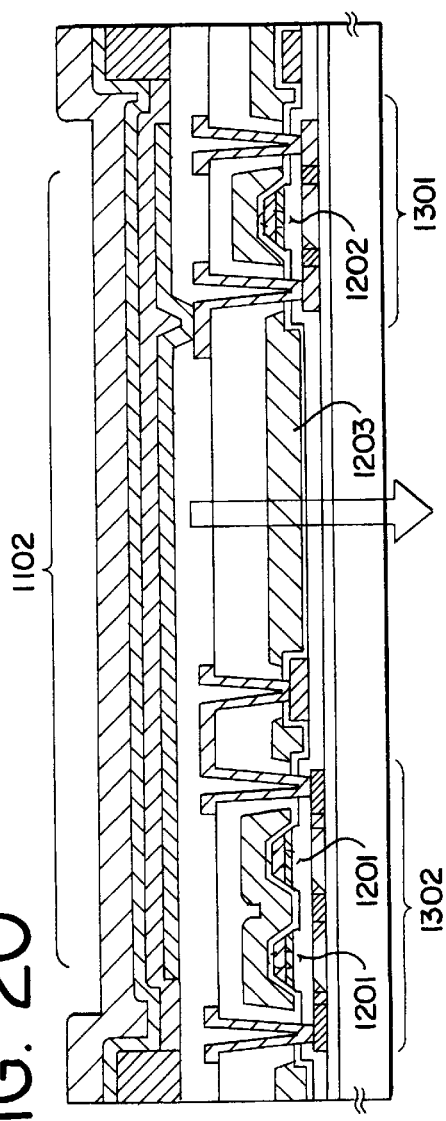
FIG. 20 is a diagram showing a structure of an active matrix EL display device (Embodiment 12)

An example of using the TFT structure shown in Embodiment 8 in the TFT structure shown in Embodiment 11 is explained in embodiment 12. FIG. 20 is used in the explanation. Note that only the TFT structure differs in the structure of FIG. 20, and therefore an explanation of other points is omitted.

In FIG. 20, a gate electrode 1201 of a switching TFT 1302 and a gate electrode 1202 of an electric current control TFT 1301 have a tapered shape. Embodiment 8 may be referred to regarding a method of manufacturing these TFTs.

Similar to Embodiment 11, when using a material which emits white color light as a light emitting layer, light emitted from an EL element is irradiated passing through a substrate, and is colorized at that time by a color filter 1203 formed on the substrate side. Further, when using materials which emits colored light, the color filter 1203 fulfills a role as a filter for increasing color purity. Note that the TFT is protected from light degradation by forming the color filter 1203 on the TFT element.

Note that it is possible to implement the constitution of Embodiment 12 by freely combining it with the constitution of any of Embodiments 1 to 6.

[Embodiment 13]

Figure 21:
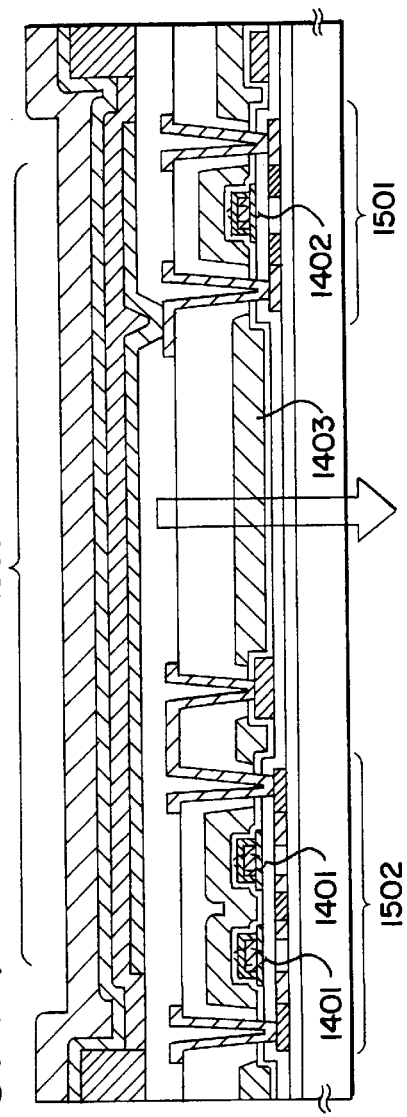
FIG. 21 is a diagram showing a structure of an active matrix EL display device (Embodiment 13)

An example of using the TFT structure shown in Embodiment 8 in the TFT structure shown in embodiment 11 is explained in Embodiment 13. FIG. 21 is used in the explanation. Note that only the TFT structure differs in the structure of FIG. 21, and therefore an explanation of other points is omitted.

In FIG. 21, a gate electrode 1401 of a switching TFT 1502 and a gate electrode 1402 of an electric current control TFT 1501 have a tapered shape. Embodiment 8 may be referred to regarding a method of manufacturing these TFTs.

Similar to Embodiment 11, when using a material which emits white color light as a light emitting layer, light emitted from an EL element is irradiated passing through a substrate, and is colorized at that time by a color filter 1403 formed on the substrate side. Further, when using a materials which emits colored light, the color filter 1403 fulfills a role as a filter for increasing color purity. Note that the TFT is protected from light degradation by forming the color filter 1403 on the TFT element.

Note that it is possible to implement the constitution of Embodiment 13 by freely combining it with the constitution of any of Embodiments 1 to 6.

[Embodiment 14]

In this embodiment, top view and cross sectional view of EL (electro luminescence) display device which is manufactured using Embodiments 11 to 13 are explained.

Figure 22A:
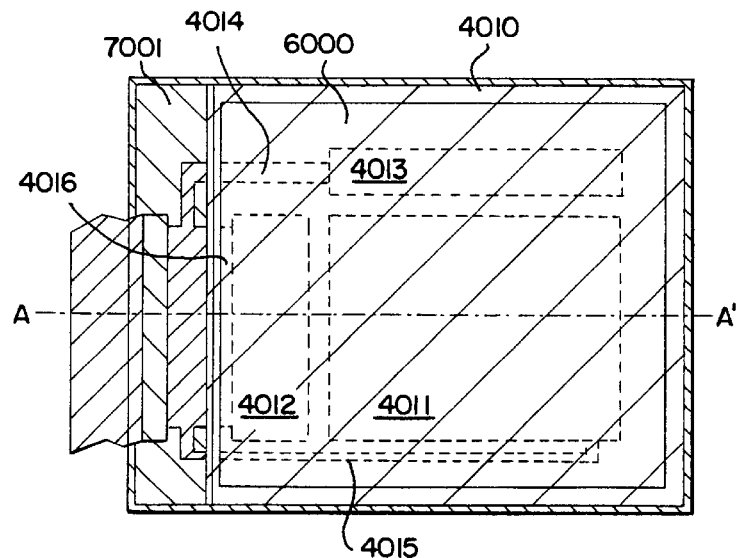
FIGS. 22A and 22B are diagrams showing external views of an active matrix EL display device (Embodiment 14)

FIG. 22A is a top view of an EL display device using the present invention. In FIG. 22A, reference numeral 4010 denotes a substrate, 4011 denotes a pixel section, 4012 denotes a source side driving circuit, and 4013 denotes a gate side driving circuit. Both driving circuits lead to an FPC 4017 through wirings 4014 to 4016, and thus connect to external equipment.

A cover 6000, a sealing material (also called a housing material) 7000, and a sealant (a second sealing material) 7001 are formed so as to surround at least the pixel section, and preferably both the pixel section and the driving circuits at this point.

Figure 22B:
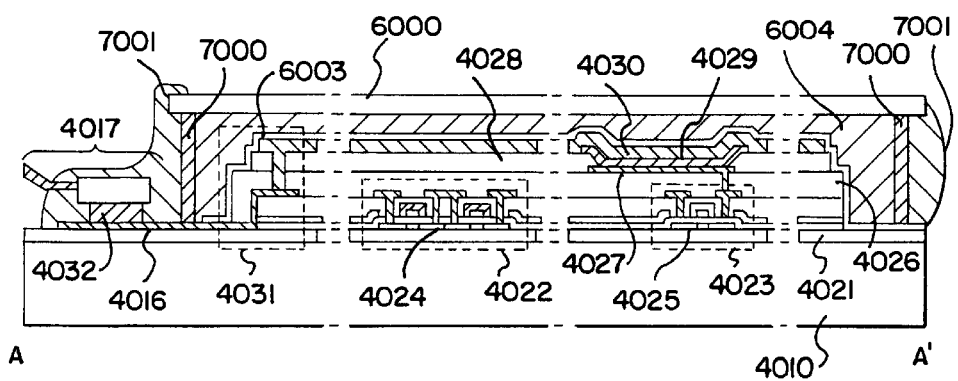

FIG. 22B is the cross sectional structure of the EL display device of this embodiment. A driving circuit TFT (a CMOS circuit combining an n-channel TFT and a p-channel TFT is shown here) 4022 and a pixel section TFT 4023 (the only TFT that controls the current to the EL element is shown here.) are formed on the substrate 4010 and a base film 4021. These TFTs can be used well known structure (a top gate structure or a bottom gate structure).

After completing the driving circuit TFT 4022 and the pixel section TFT 4023 using the present invention, a pixel electrode 4027 is formed by a transparent conductive film, on an interlayer insulating film (a flattening film) 4026 made of resin material, in order to electrically connect to the drain of the pixel section TFT 4023. An indium oxide and tin oxide compound (called ITO), or an indium oxide and zinc oxide compound can be used as the transparent conductive film. Then, after forming the pixel electrode 4027, an insulating film 4028 is formed, and an open section is formed on the pixel electrode 4027.

An EL layer 4029 is formed next. Any known EL materials (hole injection layer, hole transport layer, illumination layer, electron transport layer, electron injection layer) may be freely combined and used in a laminate structure or a single layer structure. A known technique may be used to determine the structure type. Further, there are low molecular materials and high molecular materials (polymers) as EL materials. An evaporation method is used for low molecular materials, but it is possible to use an easy method such as spin coating, printing, or ink jet for high molecular materials.

The EL layer is formed in this embodiment by an evaporation method using a shadow mask. In this embodiment, a method of combining a luminescence layer and color filter is used. As shown in Embodiment 11 to 13, color filters are at the bottom layer of pixel electrode. There are a method of forming a luminescence layer that can emit different wavelengths of light for each pixel (red light emitting layer, green light emitting layer, and blue light emitting layer). The color filters play a role of increasing the color purity in the case. Of course a single color emitting EL display device is also possible.

After forming the EL layer 4029, a cathode 4030 is formed on top. It is preferable to remove as much as possible of the moisture and oxygen existing in the interface between the cathode 4030 and the EL layer 4029. Therefore, it is necessary to form the EL layer 4029 and the cathode 4030 inside a vacuum by successive film deposition, or to form the EL layer 4029 in an inert atmosphere and then form the cathode 4030 without exposure to the atmosphere. It is possible to perform the above film deposition in this embodiment by using a multi-chamber system (cluster tool system) deposition device.

Note that a laminate structure of a LiF (lithium fluoride) film and an Al (aluminum) film is used for the cathode 4030 in this embodiment. Specifically, a 1 nm thick LiF (lithium fluoride) film is formed on the EL layer 4029 by evaporation, and a 300 nm thick aluminum film is formed on top of that. Of course an MgAg electrode, a known cathode material, may be used. Then the cathode 4030 is connected to the wiring 4016 in the region denoted with the reference numeral 4031. The wiring 4016 is a power supply line in order to apply a preset voltage to the cathode 4030, and is connected to the FPC 4017 through a conductive paste material 4032.

The region denoted by reference numeral 4031 electrically connects the cathode 4030 and the wiring 4016, so it is necessary to form contact holes in the interlayer insulating film 4026 and the insulating film 4028. The contact holes may be formed during etching of the interlayer insulating film 4026 (when forming the pixel electrode contact hole) and during etching of the insulating film 4028 (when forming the open section before forming the EL layer). Further, etching may proceed in one shot all the way to the interlayer insulating film 4026 when etching the insulating film 4028. In this case the contact holes can have a good shape provided that the interlayer insulating film 4026 and the insulating film 4028 are the same resin material.

A passivation film 6003, a filler 6004, and a cover 6000 are formed, covering the surface of the EL element thus formed.

In addition, a sealing material is formed on the inside of the cover 6000 and the substrate 4010, so as to surround the EL element section, and the sealant 7001 (the second sealing material) is formed on the outside of the sealing material 7000.

At this point the filler 6004 also functions as an adhesive in order to bond the cover 6000. PVC (polyvinyl chloride), epoxy resin, silicone resin, PVB (polyvinyl butyral), or EVA (ethylene vinyl acetate) can be used as the filler 6004. If a drying agent is formed on the inside of the filler 6004, a moisture absorption effect can be maintained, so this is preferable.

Further, spacers may be included within the filler 6004. The spacers may be of a powdered substance such as BaO, etc., giving the spacers themselves the ability to absorb moisture.

When using spacers, the passivation film 6003 can relieve the spacer pressure. Further, a resin film, etc., can be formed separately from the passivation film 6003 to relieve the spacer pressure.

In addition, a glass plate, an aluminum plate, a stainless steel plate, an FRP (fiberglass-reinforced plastic) plate, a PVF (polyvinyl fluoride) film, a Mylar film, a polyester film, or an acrylic film can be used as the cover 6000. Note that if PVB or EVA is used as the filler 6004, it is preferable to use a sheet with a structure in which several tens of mm of aluminum foil is sandwiched by a PVF film or a Mylar film.

In addition, the wiring 4016 is electrically connected to the FPC 4017 through the opening among the sealing material 7000, the sealant 7001 and the substrate 4010. Note that an explanation of the wiring 4016 has been made, and the wirings 4014 and 4015 are also connected electrically to the FPC 4017 by similarly passing underneath the sealing material 7000 the sealant 7001.

[Embodiment 15]

An example of a top gate type TFT is shown in Embodiment 1, but an example of using a reverse stagger type TFT as a TFT structure is shown in Embodiment 15.

Figure 24:
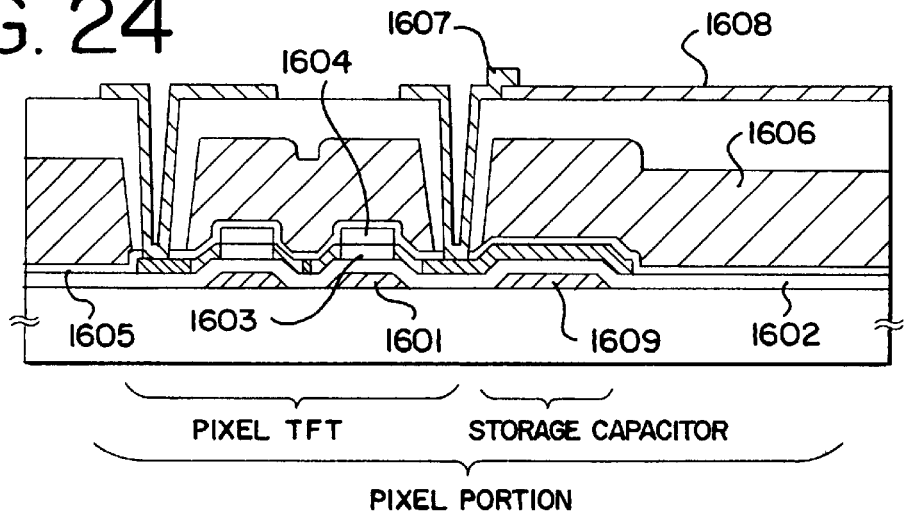
FIG. 24 is a diagram showing an active matrix substrate (Embodiment 15)

A pixel TFT (double gate structure) in a pixel portion is focused upon and explained in FIG. 24.

A gate insulating film 1602 is formed covering a gate electrode 1601 and a capacitor electrode 1609 on a substrate in FIG. 24. Semiconductor layers are formed on the gate insulating film 1602. Among the semiconductor layers, a channel forming region protected by a channel protecting film 1604 exists on a gate electrode. Further, an impurity which imparts n-type conductivity is added to the semiconductor layers apart from the channel forming region, forming a source region, a drain region, and an LDD region. A protecting insulating film 1605 is formed in order to protect the semiconductor layers, and a red colored color filter 1606 is formed contacting the protecting insulating film. Further, an interlayer insulating film is formed covering the color filter 1606. A pixel electrode 1608 and a pixel TFT are connected by a connection electrode 1607. Furthermore, a storage capacitor is structured by the capacitor electrode, the gate insulating film, and the semiconductor layer on the capacitor electrode.

The color filter 1606 formed on the TFT is formed with an objective of protecting the semiconductor layers, in particular the channel forming region 1603, from degradation due to light. Furthermore, the color filter formed under the pixel electrode is formed for colorization.

[Embodiment 16]

An example of a top gate type TFT with a polysilicon active layer is shown in Embodiment 1, but an example of a reverse stagger type TFT structure with an amorphous silicon as a semiconductor layer is shown in Embodiment 16.

Figure 25:
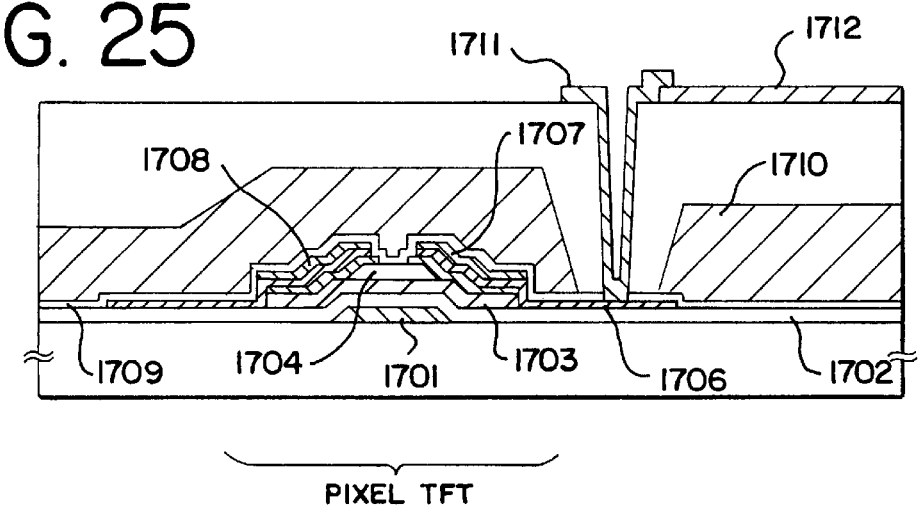
FIG. 25 is a diagram showing an active matrix substrate (Embodiment 16)

A pixel TFT (single gate structure) in a pixel portion is focused upon and explained in FIG. 25.

A gate insulating film 1702 is formed covering a gate electrode 1701 on a substrate in FIG. 25. An active layer 1703 composed of a semiconductor layer is formed on the gate insulating film 1702. An n-type semiconductor layer in which phosphorous is doped is formed on the semiconductor layer, and an etching stopper 1704 is formed on the gate electrode. A protecting insulating film 1709 is formed in order to protect the semiconductor layer, and a red colored color filter 1710 is formed contacting the protecting insulating film. Further, an interlayer insulating film is formed covering the color filter 1710. A pixel electrode 1712 and a pixel TFT are connected by a connection electrode 1711.

The color filter 1710 formed on the TFT is formed with an objective of protecting the semiconductor layer, in particular a channel forming region 1710, from degradation due to light. Furthermore, the color filter formed under the pixel electrode is formed for colorization.

[Embodiment 17]

An example of a top gate type TFT is shown in Embodiment 1, but an example of a TFT structure having a sidewall is shown in Embodiment 17.

Figure 26:
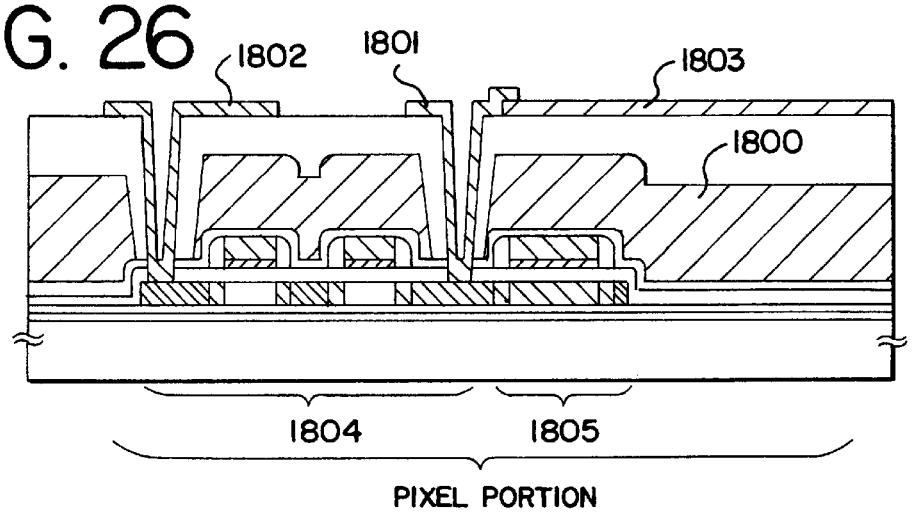
FIG. 26 is a diagram showing an active matrix substrate (Embodiment 17)

A pixel TFT (double gate structure) in a pixel portion is focused upon and explained in FIG. 26. Note that the only point differing from Embodiment 1 is the TFT structure, and therefore other explanations are omitted.

A gate electrode is formed by a lamination structure of tungsten and a silicide, and a sidewall is formed by anisotropic etching.

Further, a color filter 1800 formed on a pixel TFT is formed with the objective of protecting a semiconductor layer, in particular a channel forming region, from degradation due to light. The color filter formed under the pixel electrode is formed for colorization.

[Embodiment 18]

CMOS circuits and pixel matrix circuit formed in accordance with the present invention can be used in various electro optical devices (active matrix type liquid crystal display, active matrix type EL display or active matrix type EC display). In other words, the present invention can be applied to all of the electronic appliances having these electro optical devices as the display section.

The following can be given as examples of this type of electronic appliances: video cameras; digital cameras; projectors (rear type or front type); head mounted displays (goggle type display); game machines; car navigation systems; car stereo; personal computers; portable information terminals (such as mobile computers, portable telephones and electronic notebook). Some examples of these are shown in FIGS. 27 and 28.

Figure 27A:
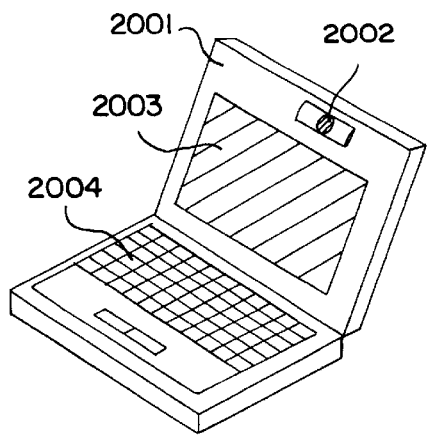
FIGS. 27A to 27F are diagrams showing examples of electronic equipment (Embodiment 18)

FIG. 27A is a personal computer, which comprises: a main body 2001; an image input section 2002; a display portion 2003; and a keyboard 2004. The present invention may be applied to the image input section 2002, display portion 2003 or other signal control circuits.

Figure 27B:
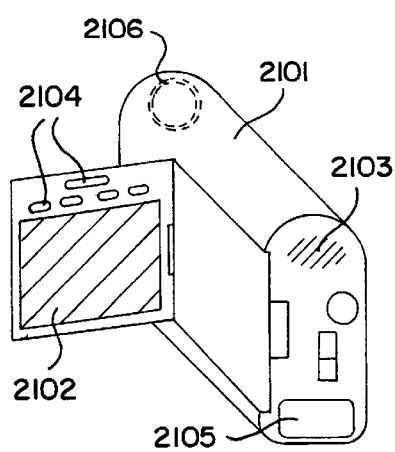

FIG. 27B is a video camera, which comprises a main body 2101; a display portion 2102; a voice input section 2103; operation switches 2104; a battery 2105; and an image receiving section 2106. The present invention can be applied to the display portion 2102 or other signal control circuits.

Figure 27C:
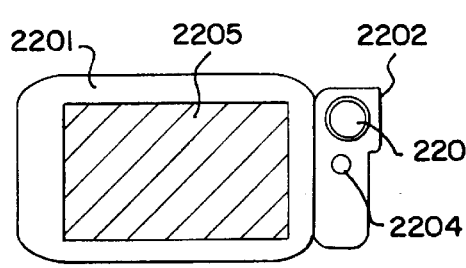

FIG. 27C is a mobile computer, which comprises: a main body 2201; a camera section 2202; an image receiving section 2203; operation switches 2204; and a display portion 2205. The present invention can be applied to the display device 2205 or other signal control circuits.

Figure 27D:
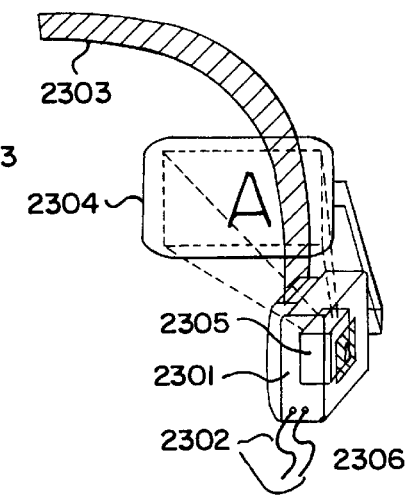

FIG. 27D is a portion of head mounted EL display (right handed), which comprises a main body 2301; signal cable 2302; head band 2303; display portion 2304, optical system 2305 and display device 2306. The present invention can be applied to the display device 2306.

Figure 27E:
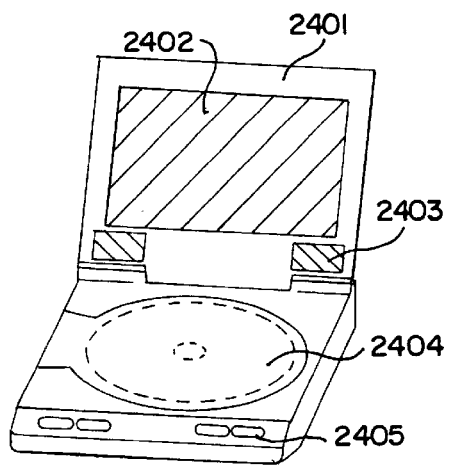

FIG. 27E is a player that uses a recording medium on which a program is recorded (hereinafter referred to as a recording medium), which comprises: a main body 2401; a display portion 2402; a speaker section 2403; a recording medium 2404; and operation switches 2405. Note that music appreciation, film appreciation, games, and the use of the Internet can be performed with this device using a DVD (digital versatile disk), a CD, etc., as a recording medium. The present invention can be applied to the display portion 2402, or to other signal control circuits.

Figure 27F:
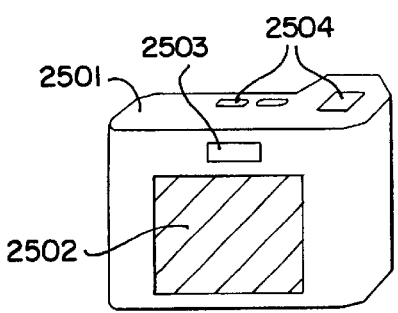

FIG. 27F is a digital camera, which comprises a main body 2501; display portion 2502; an eye contact portion 2903; an operation switches 2905 and a image receiving section (not shown in figures) and the like. The present invention can be applied to the display portion 2502 or other signal control circuits.

Figure 28A:
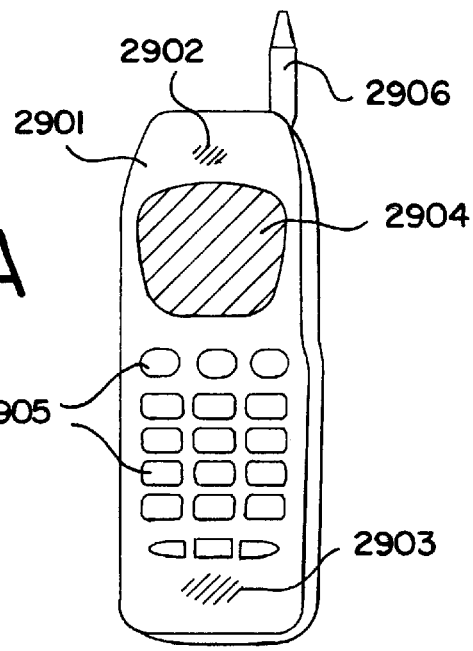
FIGS. 28A to 28C are diagrams showing examples of electronic equipment (Embodiment 18).

FIG. 28A is a portable telephone, which comprises a main body 2901; a sound output portion 2902; a sound input portion 2903; a display portion 2904; an operation switches 2905, an antenna 2906 and the like. The present invention can be applied to the sound out put portion 2902, the sound input portion 2903, a display device 2904 or other signal control circuits.

Figure 28B:
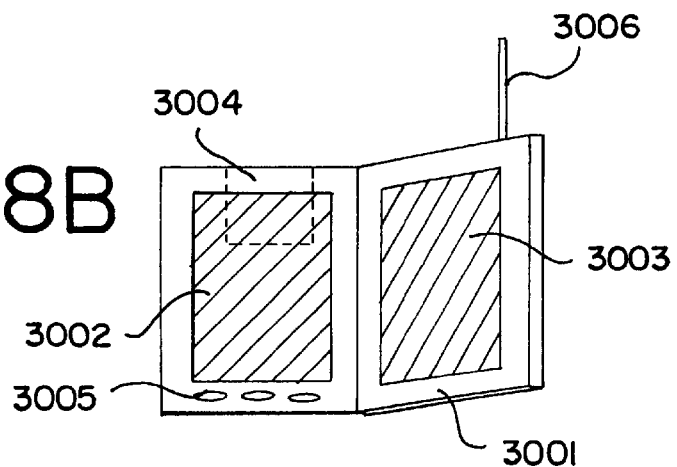

FIG. 28B is a portable book (electronic book), which comprises: a main body 3001; a display portion 3002, 3003; a recording medium 3004, an operation switches 3005 an antenna 3006 and the like. The present invention can be applied to the display portion 3002, 3003 or other signal control circuits.

Figure 28C:
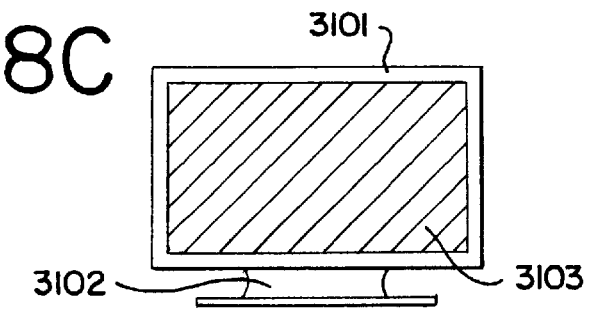

FIG. 28C is a display, which comprises a main body 3101; a support table 3102, and a display portion 3103. The present invention can be used in the display portion 3103. The display is advantageous for cases of making large sized screens because it has a wider angle of view compared with a liquid crystal display, and is advantageous in displays having a diagonal equal to or greater than 10 inches (especially for those having a diagonal equal to or greater than 30 inches).

As shown above, the applicable range of the present invention is extremely wide, and it is possible to apply the present invention to electronic appliance in all fields. The electro devices of this invention can be freely combined with any structure in Embodiments 1 to 17.

A color filter fulfills a role as a black mask in accordance with the present invention, and therefore a process for forming a black mask, conventionally required, can be omitted. The present invention can utilize irrespective of structure of thin film transistors.

What is claimed is:

1. A semiconductor device comprising:
   a pixel TFT formed in a pixel portion on a substrate;
   a p-channel TFT and an n-channel TFT formed in a driving circuit in a periphery of said pixel portion on said substrate;
   a color filter formed over at least gate electrodes of the pixel TFT in the pixel portion and the p-channel TFT and the n-channel TFT in the driving circuit;
   an interlayer insulating film formed over the color filter, the interlayer insulating film comprising organic insulating material; and
   electrodes formed on the interlayer insulating film and electrically connected to the pixel TFT, the p-channel TFT, and the n-channel TFT, respectively, via openings in the color filter and the interlayer insulating film.

2. A device according to claim 1, further comprising a pixel electrode formed in the pixel portion, on the interlayer insulating film, the pixel electrode connected to one of the electrodes which is connected to the pixel TFT.

3. A device according to claim 2, wherein the pixel electrode formed in the pixel portion has light transmitting properties.

4. A device according to claim 1, wherein the p-channel TFT in the driving circuit is at least used as an analog switch.

5. A device according to claim 1, wherein the gate electrodes of the pixel TFT, the p-channel TFT, and the n-channel TFT comprise a heat resistant conducting material and are extended from the driving circuit, and
   wherein a gate wiring connected to the gate electrodes comprises a low resistance conducting material.

6. A device according to claim 5, wherein the heat resistant conducting material is an element selected from the group consisting of tantalum (Ta), titanium (Ti), molybdenum (Mo), tungsten (W), a chemical compound comprising at least one element thereof, a nitride comprising at least one element thereof, and a silicide comprising at least one element thereof.

7. A device according to claim 1, wherein an angle of a tapered portion of each of the gate electrodes is from 5 to 45°.

8. A device according to claim 1, wherein the semiconductor device is a liquid crystal display device.

9. A device according to claim 1, wherein the semiconductor device is an EL display device.

10. A device according to claim 1, wherein the semiconductor device is an electronic device selected from the group consisting of a personal computer, a video camera, a portable information terminal, a digital camera, a digital video disk player, and an electronic amusement device.

11. A semiconductor device comprising:
a pixel TFT formed in a pixel portion on a substrate;
a p-channel TFT and an n-channel TFT formed in a driving circuit in a periphery of said pixel portion on said substrate;
a protecting insulating film formed over at least gate electrodes of the pixel TFT in the pixel portion and the p-channel TFT and the n-channel TFT in the driving circuit, the protecting insulating film comprising an inorganic insulating material;
a color filter formed over the pixel TFT, the p-channel TFT, and the n-channel TFT with the protective insulating film interposed therebetween;
an interlayer insulating film formed over the color filter, the interlayer insulating film comprising organic insulating material; and
electrodes formed on the interlayer insulating film and electrically connected to the pixel TFT, the p-channel TFT, and the n-channel TFT, respectively, via openings in the protecting insulating film, the color filter, and the interlayer insulating film.

12. A device according to claim 11, wherein the color filter formed over the p-channel TFT and the n-channel TFT of the driving circuit is a colored film which is colored red.

13. A device according to claim 11, wherein the color filter formed over the pixel TFT is a colored film which is colored red.

14. A device according to claim 11, further comprising a pixel electrode formed in the pixel portion and located on the interlayer insulating film, the pixel electrode connected to one of the electrodes which is connected to the pixel TFT.

15. A device according to claim 14, wherein the pixel electrode formed in the pixel portion has light transmitting properties.

16. A device according to claim 11, wherein the p-channel TFT of the driving circuit is at least used as an analog switch.

17. A device according to claim 11, wherein the gate electrodes of the pixel TFT, the p-channel TFT and the n-channel TFT of the driving circuit comprise a heat resistant conducting material and are extended from the driving circuit, and
wherein a gate wiring connected to the gate electrodes comprises a low resistance conducting material.

18. A device according to claim 17, wherein the heat resistant conducting material is an element selected from the group consisting of tantalum (Ta), titanium (Ti), molybdenum (Mo), tungsten (W), a chemical compound comprising at least one element thereof, a nitride comprising at least one element thereof, and a suicide comprising at least one element thereof.

19. A device according to claim 11, wherein an angle of a tapered portion of each the gate electrodes is from 5 to 45°.

20. A device according to claim 11, wherein the semiconductor device is a liquid crystal display device.

21. A device according to claim 11, wherein the semiconductor device is an EL display device.

22. A device according to claim 11, wherein the semiconductor device is an electronic device selected from the group consisting of a personal computer, a video camera, a portable information terminal, a digital camera, a digital video disk player, and an electronic amusement device.

23. A semiconductor device comprising:
a pixel TFT formed in a pixel portion on a substrate; and
a p-channel TFT and an n-channel TFT formed in a driving circuit in a periphery of said pixel portion on said substrate;
a protecting insulating film formed over at least gate electrodes of the pixel TFT, the p-channel TFT and the n-channel TFT in the driving circuit, the protecting insulating film comprising an inorganic insulating material;
a color filter formed over the pixel TFT in the pixel portion and the p-channel TFT and the n-channel TFT in the driving circuit with the protective insulating film interposed therebetween;
an interlayer insulating film formed over the color filter, the interlayer insulating film comprising organic insulating material;
electrodes formed on the interlayer insulating film and electrically connected to the pixel TFT, the p-channel TFT, and the n-channel TFT, respectively, via openings in the protecting film, the color filter, and the interlayer insulating film; and
a pixel electrode formed in the pixel portion and located on the interlayer insulating film, the pixel electrode connected to one of the electrodes which is connected to the pixel TFT.

24. A device according to claim 23, wherein the color filter formed over the p-channel TFT and the n-channel TFT of the driving circuit is a colored film which is colored red.

25. A device according to claim 23, wherein the color filter formed over the pixel TFT is a colored film which is colored red.

26. A device according to claim 23, wherein the pixel electrode formed in the pixel portion has light transmitting properties.

27. A device according to claim 23, wherein the p-channel TFT of the driving circuit is at least used as an analog switch.

28. A device according to claim 23, wherein the gate electrodes of the pixel TFT, the p-channel TFT, and the n-channel TFT comprise a heat resistant conducting material and are extended from the driving circuit, and
wherein a gate wiring connected to the gate electrodes comprises a low resistance conducting material.

29. A device according to claim 28, wherein the heat resistant conducting material is an element selected from the group consisting of tantalum (Ta), titanium (Ti), molybdenum (Mo), tungsten (W), a chemical compound comprising at least one element thereof, a nitride comprising at least one element thereof, and a silicide comprising at least one element thereof.

30. A device according to claim 23, wherein an angle of a tapered portion of each the gate electrodes is from 5 to 45°.

31. A device according to claim 23, wherein the semiconductor device is a liquid crystal display device.

32. A device according to claim 23, wherein the semiconductor device is an EL display device.

33. A device according to claim 23, wherein the semiconductor device is an electronic device selected from the group consisting of a personal computer, a video camera, a portable information terminal, a digital camera, a digital video disk player, and an electronic amusement device.

34. A semiconductor device comprising:

a pixel TFT formed in a pixel portion on a substrate; and a p-channel TFT and an n-channel TFT formed in a driving circuit in a periphery of said pixel portion on said substrate, a color filter formed over the pixel TFT in the pixel portion and the p-channel TFT and the n-channel TFT in the driving circuit;

an interlayer insulating film formed over the color filter, the interlayer insulating film comprising organic insulating material;

electrodes formed on the interlayer insulating film and electrically connected to the pixel TFT, the p-channel TFT, and the n-channel TFT, respectively, via openings in the color filter and the interlayer insulating film; and a pixel electrode formed in the pixel portion and located on the interlayer insulating film, the pixel electrode electrically connected to the pixel TFT via one of the electrodes, wherein the pixel TFT is connected to a light emitting element in the pixel portion.

35. A device according to claim 34, wherein in the pixel portion, red color filters are formed over the pixel TFTs and green and blue color filters are formed adjacent to the pixel electrodes.

36. A device according to claim 34, wherein the color filter formed over the p-channel TFT and the n-channel TFT of the driving circuit is a colored film which is colored red.

37. A device according to claim 34, wherein the color filter formed over the pixel TFT is a colored film which is colored red.

38. A device according to claim 34, wherein light emitted from the light emitting element is irradiated passing through the substrate.

39. A device according claim 34, wherein the semiconductor device is an EL display device.

40. A device according claim 34, wherein the semiconductor device is an electronic device selected from the group consisting of a personal computer, a video camera, a portable information terminal, a digital camera, a digital video disk player, and an electronic amusement device.

41. A semiconductor device comprising:

a pixel TFT formed in a pixel portion on a substrate; and a p-channel TFT and an n-channel TFT formed in a driving circuit in a periphery of said pixel portion on said substrate, a protecting insulating film formed over at least gate electrodes of the pixel TFT, the p-channel TFT and the n-channel TFT in the driving circuit, the protecting insulating film comprising an inorganic insulating material;

a color filter formed over the pixel TFT in the pixel portion and the p-channel TFT and the n-channel TFT in the driving circuit with the protective insulating film interposed therebetween;

electrodes formed on the interlayer insulating film and electrically connected to the pixel TFT, the p-channel TFT, and the n-channel TFT, respectively, via openings in the protecting film, the color filter, and the interlayer insulating film; and a pixel electrode formed in the pixel portion and located over the color filter, the pixel electrode connected to one of the electrodes which is connected to the pixel TFT; and a light emitting element formed in the pixel portion and electrically connected to the pixel TFT.

42. A device according to claim 41, wherein the color filter formed over the p-channel TFT and the n-channel TFT of the driving circuit is a colored film which is colored red.

43. A device according to claim 41, wherein the color filter formed over the pixel TFT is a colored film which is colored red.

44. A device according to claim 41, wherein light emitted from the light emitting element is irradiated passing through the substrate.

45. A device according to claim 41, wherein the semiconductor device is an EL display device.

46. A device according to claim 41, wherein the semiconductor device is an electronic device selected from the group consisting of a personal computer, a video camera, a portable information terminal, a digital camera, a digital video disk player, and an electronic amusement device.

* * * * *